United States Patent
Seong et al.

(10) Patent No.: US 11,411,010 B2
(45) Date of Patent: Aug. 9, 2022

(54) SEMICONDUCTOR MEMORY DEVICES

(71) Applicant: Samsung Electronics Co., Ltd., Suwon-si (KR)

(72) Inventors: Hyejin Seong, Suwon-si (KR); Jisuk Park, Seoul (KR); Sungho Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 16/865,574

(22) Filed: May 4, 2020

(65) Prior Publication Data
US 2021/0082924 A1 Mar. 18, 2021

(30) Foreign Application Priority Data
Sep. 17, 2019 (KR) .......................... 10-2019-0114364

(51) Int. Cl.
*H01L 27/108* (2006.01)

(52) U.S. Cl.
CPC .. *H01L 27/10897* (2013.01); *H01L 27/10814* (2013.01); *H01L 27/10823* (2013.01); *H01L 27/10855* (2013.01); *H01L 27/10876* (2013.01); *H01L 27/10888* (2013.01); *H01L 27/10894* (2013.01)

(58) Field of Classification Search
None
See application file for complete search history.

(56) References Cited

U.S. PATENT DOCUMENTS

| 8,928,073 | B2 * | 1/2015 | Jang ................ H01L 21/823481 257/334 |
| 10,249,627 | B2 | 4/2019 | Han et al. |
| 10,263,066 | B2 * | 4/2019 | Hiroi ................... H01L 23/5329 |
| 2011/0165756 | A1 * | 7/2011 | Isogai ................. H01L 27/0207 438/397 |
| 2013/0009273 | A1 * | 1/2013 | Kim ...................... H01L 27/105 257/496 |
| 2014/0291804 | A1 * | 10/2014 | Kim ..................... G11C 11/4099 257/532 |
| 2018/0166450 | A1 * | 6/2018 | Kim .................. H01L 27/10885 |
| 2018/0342521 | A1 * | 11/2018 | Son ................... H01L 21/76816 |
| 2019/0033707 | A1 | 1/2019 | Yang et al. |

FOREIGN PATENT DOCUMENTS

| JP | 2014022457 A | 2/2014 |
| KR | 1020110077432 A | 7/2011 |

* cited by examiner

*Primary Examiner* — Steven M Christopher
(74) *Attorney, Agent, or Firm* — Muir Patent Law, PLLC

(57) ABSTRACT

A semiconductor memory device includes a substrate having a memory cell region, a peripheral region, and a dam region between the memory cell region and the peripheral region, the memory cell region having a rectangular shape according to a top view and having a plurality of active regions defined therein; a plurality of bit line structures extending on the substrate in the memory cell region to be parallel with each other in a first horizontal direction, each including a bit line; a plurality of buried contacts filling lower portions of spaces among the plurality of bit line structures on the substrate; a plurality of landing pads on the plurality of buried contacts; and a dam structure including a first dam structure and a second dam structure in the dam region and being at the same level as the plurality of landing pads.

19 Claims, 28 Drawing Sheets

SEMICONDUCTOR MEMORY DEVICES

CROSS-REFERENCE TO RELATED APPLICATION

This application claims the benefit of Korean Patent Application No. 10-2019-0114364, filed on Sep. 17, 2019, in the Korean Intellectual Property Office, the disclosure of which is incorporated herein in its entirety by reference.

BACKGROUND

The inventive concept relates to semiconductor memory devices, and more particularly, to semiconductor memory devices including a dam structure between a memory cell region and a peripheral region.

With the rapid development of the electronics industry and user needs, electronic equipment is becoming lighter and more compact. Therefore, semiconductor memory devices used in electronic devices are typically needed to have a high degree of integration, and thus design rules for the components of semiconductor memory devices have been decreased. Accordingly, the pattern density difference between a memory cell region and a peripheral region in semiconductor memory devices has increased, causing an increase in difficulty in processes and making it difficult to secure structural reliability.

SUMMARY

The inventive concept provides semiconductor memory devices for decreasing difficulty in manufacturing processes and securing structural reliability.

According to an aspect of the inventive concept, there is provided a semiconductor memory device including a substrate having a memory cell region, a peripheral region, and a dam region between the memory cell region and the peripheral region, the memory cell region having a rectangular shape according to a top view and having a plurality of active regions defined therein; a plurality of bit line structures extending on the substrate in the memory cell region to be parallel with each other in a first horizontal direction, each bit line structure including a bit line; a plurality of buried contacts filling lower portions of spaces among the plurality of bit line structures on the substrate; a plurality of landing pads on the plurality of buried contacts; and a dam structure including a first dam structure and a second dam structure in the dam region and being at the same level as the plurality of landing pads, the first dam structure having a line shape extending in the first horizontal direction, and the second dam structure being separated from the first dam structure with a first dam opening between the first dam structure and the second dam structure and having a line shape extending in a second horizontal direction that is perpendicular to the first horizontal direction.

According to another aspect of the inventive concept, there is provided a semiconductor memory device including a substrate having a memory cell region, a peripheral region, and a dam region between the memory cell region and the peripheral region, the memory cell region having a rectangular shape according to a top view and having a plurality of active regions defined therein; a plurality of bit line structures extending on the substrate in the memory cell region to be parallel with each other in a first horizontal direction, each bit line structure including a bit line; a plurality of gate line structures in the peripheral region, each of the plurality of gate line structures having a gate line pattern at the same level as the bit line; a buried contact filling a lower portion of a space between the plurality of bit line structures on the substrate; a landing pad on the buried contact; and a dam structure arranged along sides of the rectangular shape of the memory cell region in the dam region, wherein a side of a top surface of the dam structure extends in a straight line, the side of the top surface facing the memory cell region.

According to a further aspect of the inventive concept, there is provided a semiconductor memory device including a substrate having a memory cell region, a peripheral region, and a dam region between the memory cell region and the peripheral region, the memory cell region having a rectangular shape according to a top view and having a plurality of active regions defined therein; a plurality of word lines extending across the plurality of active regions in the memory cell region in a first horizontal direction, the plurality of word lines being parallel with each other; a plurality of bit line structures extending on the substrate in the memory cell region to be parallel with each other in a second horizontal direction that is perpendicular to the first horizontal direction, each bit line structure including a bit line; a plurality of gate line structures in the peripheral region, each of the plurality of gate line structures having a gate line pattern at the same level as the bit line in a vertical direction; a plurality of buried contacts filling lower portions of spaces among the plurality of bit line structures on the substrate; a plurality of landing pads filling upper portions of the spaces among the plurality of bit line structures and extending over the plurality of bit line structures; and a dam structure including a first dam structure and a second dam structure in the dam region and being at the same level as the plurality of landing pads in the vertical direction, the first dam structure having a line shape extending in the first horizontal direction, the second dam structure having a line shape extending in the second horizontal direction, and the first dam structure and the second dam structure being separated from each other by a first dam opening at a corner of the rectangular shape of the memory cell region, wherein each of the plurality of landing pads has a top surface having a disc shape, opposite sides of a top surface of the first dam structure extend in straight lines in the first horizontal direction, and opposite sides of a top surface of the second dam structure extend in straight lines in the second horizontal direction, the opposite sides respectively facing the memory cell region and the peripheral region.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
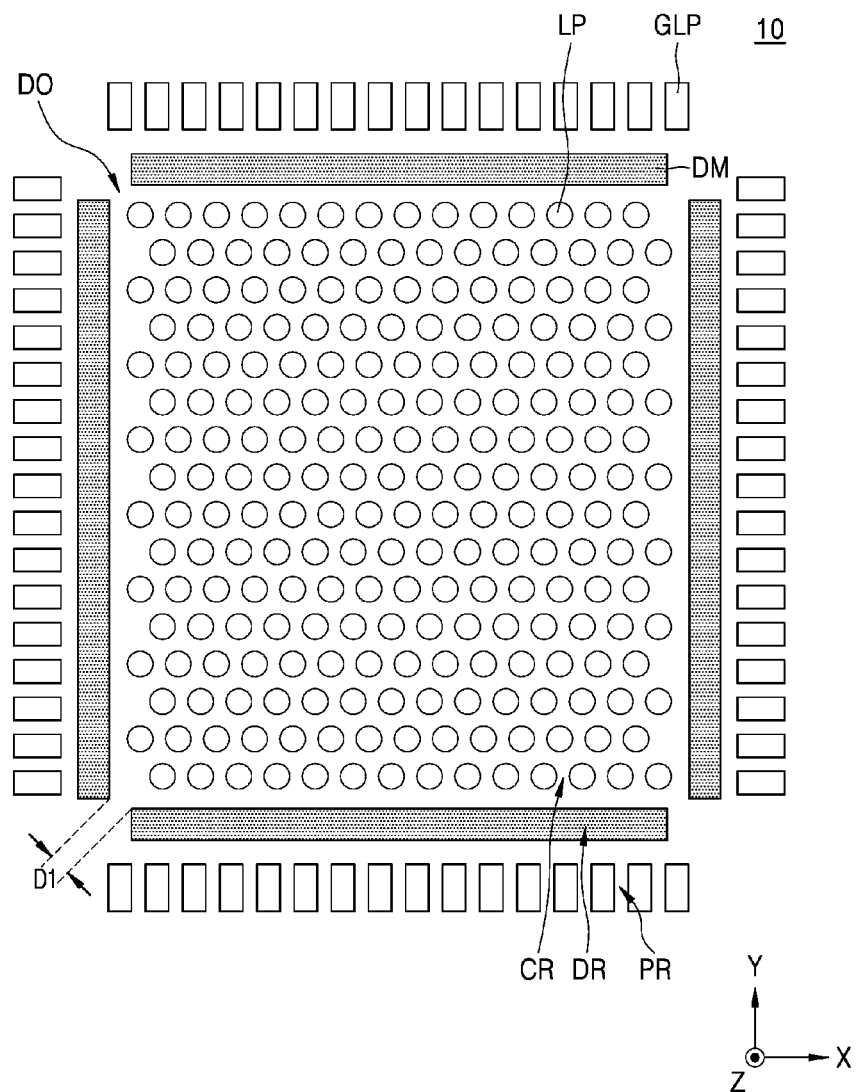
FIGS. 1 through 3 are schematic top views for describing dam structures of semiconductor memory devices, according to example embodiments.
Figure 2:
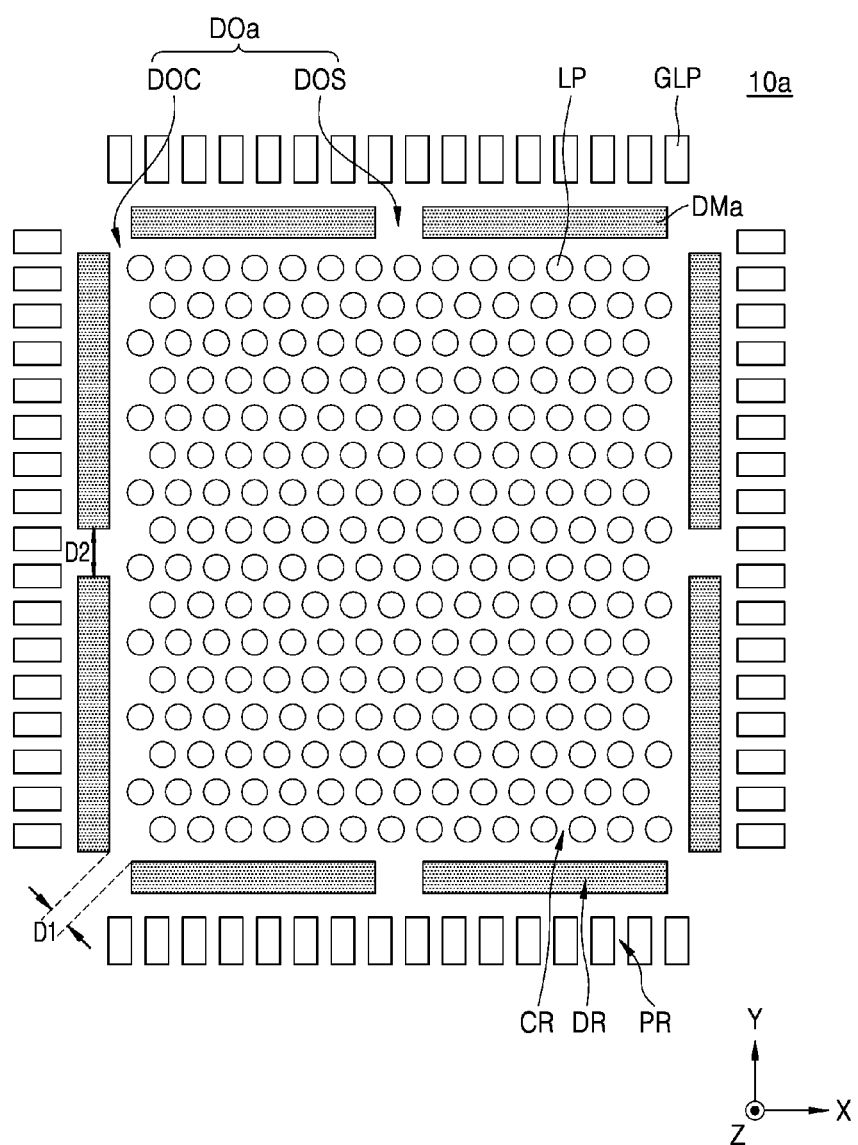
Figure 3:
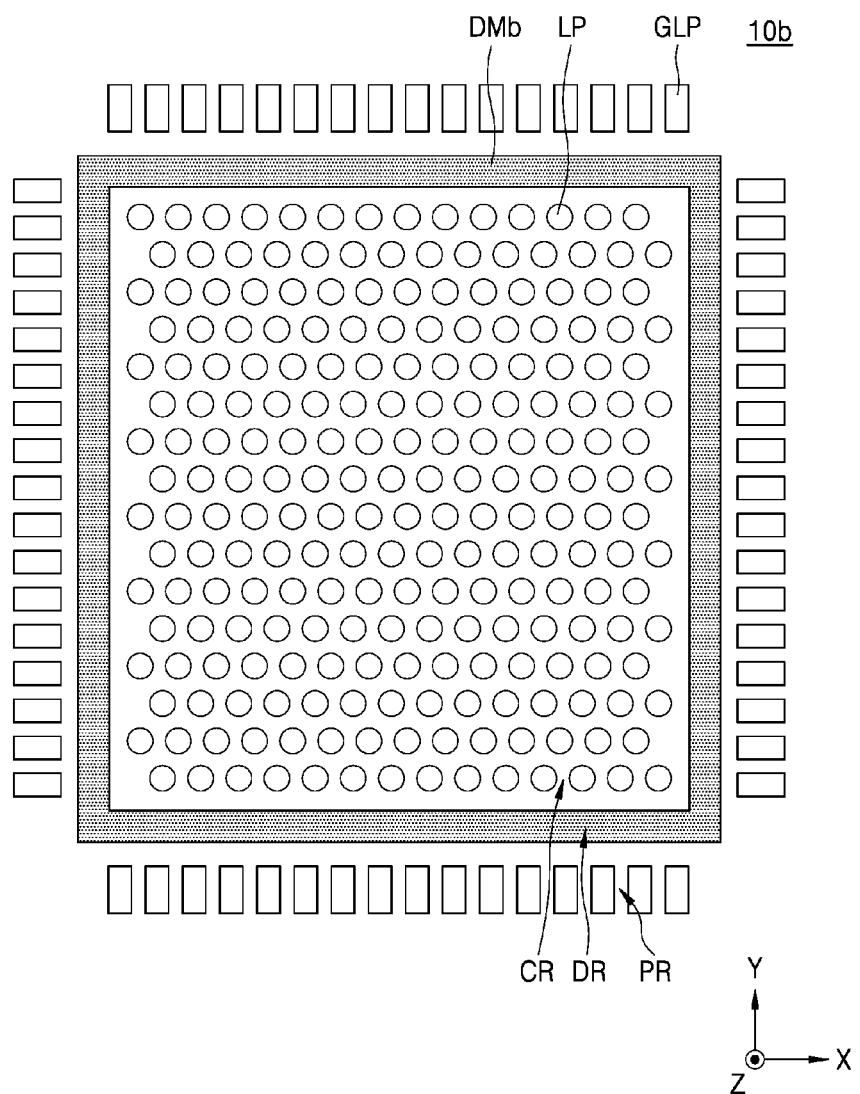

FIGS. 1 through 3 are schematic top views for describing dam structures of semiconductor memory devices, according to example embodiments.

Referring to FIG. 1, a semiconductor memory device 10 includes a memory cell region CR, a peripheral region PR, and a dam region DR between the memory cell region CR and the peripheral region PR. In some embodiments, the semiconductor memory device 10 may include a dynamic random access memory (DRAM) device. FIG. 1 illustrates a plurality of landing pads LP, which are electrically connected to a plurality of memory cells (e.g., DRAM cells) of a memory cell array, in the memory cell region CR and illustrates a plurality of gate line patterns GLP of a plurality of logic transistors in the peripheral region PR. A dam structure DM may be arranged in the dam region DR between the memory cell region CR and the peripheral region PR. The dam structure DM may decrease process difficulty caused by a difference of pattern density between the memory cell region CR and the peripheral region PR and may secure structural reliability.

Top surfaces of the landing pads LP may be at the same level as a top surface of the dam structure DM in a vertical direction (e.g., a Z direction). Top surfaces of the gate line patterns GLP may be at a lower level than the top surfaces of the landing pads LP or the top surface of the dam structure DM in the vertical direction (e.g., the Z direction).

According to the top view, the memory cell region CR may have a rectangular shape on an XY plane formed in a first horizontal direction (e.g., an X direction) and a second horizontal direction (e.g., a Y direction). The first horizontal direction (e.g., the X direction) and the second horizontal direction (e.g., the Y direction) may be orthogonal. For example, a region having a rectangular shape in a dam structure DMb in FIG. 3 may be the memory cell region CR. In some embodiments, the landing pads LP may be arranged to zigzag in the first horizontal direction (e.g., the X direction) or the second horizontal direction (e.g., the Y direction) in a honeycomb pattern.

The peripheral region PR may be referred to as a core circuit region and/or a peripheral circuit region and arranged around the memory cell region CR. A plurality of circuits used to drive the semiconductor memory device 10 or to read and/or write memory cells of the semiconductor memory device 10 may be arranged in the peripheral region PR. In some embodiments, decoders, sense amplifiers, input/output buffers, and the like may be arranged in the peripheral region PR.

The dam structure DM may extend in the first horizontal direction (e.g., the X direction) or the second horizontal direction (e.g., the Y direction). The dam structure DM may be arranged along the edge of the memory cell region CR. According to the top view, the dam structure DM may have a line shape extending along a side of the rectangular shape of the memory cell region CR on the XY plane. The dam structure DM may have a line shape having the longer axis in the first horizontal direction (e.g., the X direction) or the second horizontal direction (e.g., the Y direction). A length of the dam structure DM in the first horizontal direction (e.g., the X direction) or the second horizontal direction (e.g., the Y direction) may be similar to or less than a length of a side of the rectangular shape of the memory cell region CR.

The top surface of the dam structure DM may have a side facing the memory cell region CR and a side facing the peripheral region PR, wherein each of the two sides may have a straight line shape extending in the first horizontal direction (e.g., the X direction) or the second horizontal direction (e.g., the Y direction). For example, the side of the top surface of the dam structure DM, which faces the memory cell region CR, may have a straight line shape extending in the first horizontal direction (e.g., the X direction) or the second horizontal direction (e.g., the Y direction), without being influenced by the shapes of the top surfaces of landing pads LP adjacent to the dam structure DM.

The landing pads LP and the dam structure DM may be formed by extreme ultraviolet (EUV) lithography. In some embodiments, the landing pads LP and the dam structure DM may be formed without using technology, such as double patterning technology (DPT) or quadruple patterning technology (QPT), for increasing a pattern density. The edge of the top surface of each of the landing pads LP may have a disc shape that is substantially a circle not an oval. A side surface of the dam structure DM which faces the landing pads LP, i.e., a side surface of the dam structure DM which faces the memory cell region CR, may extend in the first horizontal direction (e.g., the X direction) or the second horizontal direction (e.g., the Y direction), without being influenced by the zigzag arrangement of the landing pads LP in the first horizontal direction (e.g., the X direction) or the second horizontal direction (e.g., the Y direction).

In some embodiments, the semiconductor memory device 10 may include a plurality of dam structures DM. Each of the dam structures DM may have a line shape extending in the first horizontal direction (e.g., the X direction) or the second horizontal direction (e.g., the Y direction) along one of four sides of the rectangular shape of the memory cell region CR. There may be a dam opening DO between respective ends of a pair of dam structures DM. The dam opening DO may be at a corner of the rectangular shape of the memory cell region CR. For example, four dam structures DM between the memory cell region CR and the peripheral region PR may respectively extend along four sides of the rectangular shape of the memory cell region CR and may be separated from each other at each corner of the rectangular shape.

The respective ends of a pair of dam structures DM may be separated from each other by a first width D1. For example, the dam opening DO may have the first width D1. In some embodiments, the dam opening DO may be at each of four corners of the rectangular shape of the memory cell region CR. In some embodiments, the first width D1 may be about 1 um to about 5 um.

Referring to FIG. 2, a semiconductor memory device 10a includes the memory cell region CR and the peripheral region PR. A dam structure DMa may be arranged between the memory cell region CR and the peripheral region PR. Top surfaces of the landing pads LP may be at the same level as a top surface of the dam structure DMa in the vertical direction (e.g., the Z direction). The top surfaces of the gate line patterns GLP may be at a lower level than the top surfaces of the landing pads LP or the top surface of the dam structure DMa in the vertical direction (e.g., the Z direction).

The dam structure DMa may extend in the first horizontal direction (e.g., the X direction) or the second horizontal direction (e.g., the Y direction). The dam structure DMa may be arranged along the edge of the memory cell region CR. According to the top view, the dam structure DMa may have a line shape extending along a side of the rectangular shape of the memory cell region CR on the XY plane. The dam structure DMa may have a line shape having the longer axis in the first horizontal direction (e.g., the X direction) or the second horizontal direction (e.g., the Y direction). A length of the dam structure DMa in the first horizontal direction (e.g., the X direction) or the second horizontal direction (e.g., the Y direction) may be less than a length of a side of the rectangular shape of the memory cell region CR.

The top surface of the dam structure DMa may have a side facing the memory cell region CR and an opposite side facing the peripheral region PR, wherein each of the two sides may have a straight line shape extending in the first horizontal direction (e.g., the X direction) or the second horizontal direction (e.g., the Y direction). For example, the side of the top surface of the dam structure DMa, which faces the memory cell region CR, may have a straight line shape extending in the first horizontal direction (e.g., the X direction) or the second horizontal direction (e.g., the Y direction), without being influenced by the shapes of the top surfaces of landing pads LP adjacent to the dam structure DMa.

A side surface of the dam structure DMa which faces the landing pads LP, i.e., a side surface of the dam structure DMa which faces the memory cell region CR, may extend in the first horizontal direction (e.g., the X direction) or the second horizontal direction (e.g., the Y direction), without being influenced by the zigzag arrangement of the landing pads LP in the first horizontal direction (e.g., the X direction) or the second horizontal direction (e.g., the Y direction).

In some embodiments, the semiconductor memory device 10a may include a plurality of dam structures DMa. Each of the dam structures DMa may have a line shape extending in the first horizontal direction (e.g., the X direction) or the second horizontal direction (e.g., the Y direction) along one of four sides of the rectangular shape of the memory cell region CR. At least two dam structures DMa may sequentially extend along at least one side of the rectangular shape of the memory cell region CR to be separated from each other. There may be a dam opening DOa between respective ends of a pair of dam structures DMa. The dam opening DOa may include a first dam opening DOC and a second dam opening DOS. The first dam opening DOC may be at a corner of the rectangular shape of the memory cell region CR. The second dam opening DOS may be at a portion of a side of the rectangular shape of the memory cell region CR, wherein the portion of the side is apart from corners of the rectangular shape.

Although eight dam structures DMa sequentially extend along the four sides of the rectangular shape of the memory cell region CR with two dam structures DMa separated from each other at each side of the rectangular shape in FIG. 2, embodiments are not limited thereto. For example, at least three dam structures DMa may sequentially extend along at least one side of the rectangular shape of the memory cell region CR to be separated from one another.

The first dam opening DOC may have the first width D1. The second dam opening DOS may have a second width D2. In some embodiments, the first width D1 and the second width D2 may be about 1 um to about 5 um. The first width D1 may be equal to the second width D2, but embodiments are not limited thereto. In some embodiments, the first width D1 may be greater than the second width D2. In some embodiments, the first width D1 may be less than the second width D2.

Although it is illustrated in FIG. 2 that the number of dam structures DMa sequentially extending to be separated from each other along each of two sides of the rectangular shape of the memory cell region CR, which extend in the first horizontal direction (e.g., the X direction), is the same as the number of dam structures DMa sequentially extending to be separated from each other along each of two sides of the rectangular shape of the memory cell region CR, which extend in the second horizontal direction (e.g., the Y direction), wherein the number of dam structures DMa is two, embodiments are not limited thereto. For example, more dam structures DMa may sequentially extend to be separated from each other along each of two longer sides of the rectangular shape of the memory cell region CR among two sides of the rectangular shape extending in the first horizontal direction (e.g., the X direction) and two sides of the rectangular shape extending in the second horizontal direction (e.g., the Y direction) than along each of two shorter sides of the rectangular shape of the memory cell region CR.

Although not shown, at least two dam structures DMa may sequentially extend to be separated from each other along each of two longer sides of the rectangular shape of the memory cell region CR, e.g., two sides extending in the second horizontal direction (e.g., the Y direction), and one dam structure DM as shown in FIG. 1 may extend along each of two shorter sides of the rectangular shape of the memory cell region CR, e.g., two sides extending in the first horizontal direction (e.g., the X direction).

Referring to FIG. 3, a semiconductor memory device 10b includes the memory cell region CR and the peripheral region PR. A dam structure DMb may be arranged between the memory cell region CR and the peripheral region PR. Top surfaces of the landing pads LP may be at the same level as a top surface of the dam structure DMb in the vertical direction (e.g., the Z direction). The top surfaces of the gate line patterns GLP may be at a lower level than the top surfaces of the landing pads LP or the top surface of the dam structure DMb in the vertical direction (e.g., the Z direction).

The dam structure DMb may have a portion extending in the first horizontal direction (e.g., the X direction) and a portion extending in the second horizontal direction (e.g., the Y direction) and surround the memory cell region CR. According to the top view, the dam structure DMb may have a rectangular shape surrounding the memory cell region CR on the XY plane.

The top surface of the dam structure DMb may have a side facing the memory cell region CR and a side facing the peripheral region PR, wherein each of the two sides may have a straight line shape extending in the first horizontal direction (e.g., the X direction) or the second horizontal direction (e.g., the Y direction). For example, the side of the top surface of the dam structure DMb, which faces the memory cell region CR, may have a straight line shape extending in the first horizontal direction (e.g., the X direction) or the second horizontal direction (e.g., the Y direction), without being influenced by the shapes of the top surfaces of landing pads LP adjacent to the dam structure DMa.

A side surface of the dam structure DMb which faces the landing pads LP, i.e., a side surface of the dam structure DMb which faces the memory cell region CR, may extend in the first horizontal direction (e.g., the X direction) or the second horizontal direction (e.g., the Y direction), without being influenced by the zigzag arrangement of the landing pads LP in the first horizontal direction (e.g., the X direction) or the second horizontal direction (e.g., the Y direction).

Figure 4:
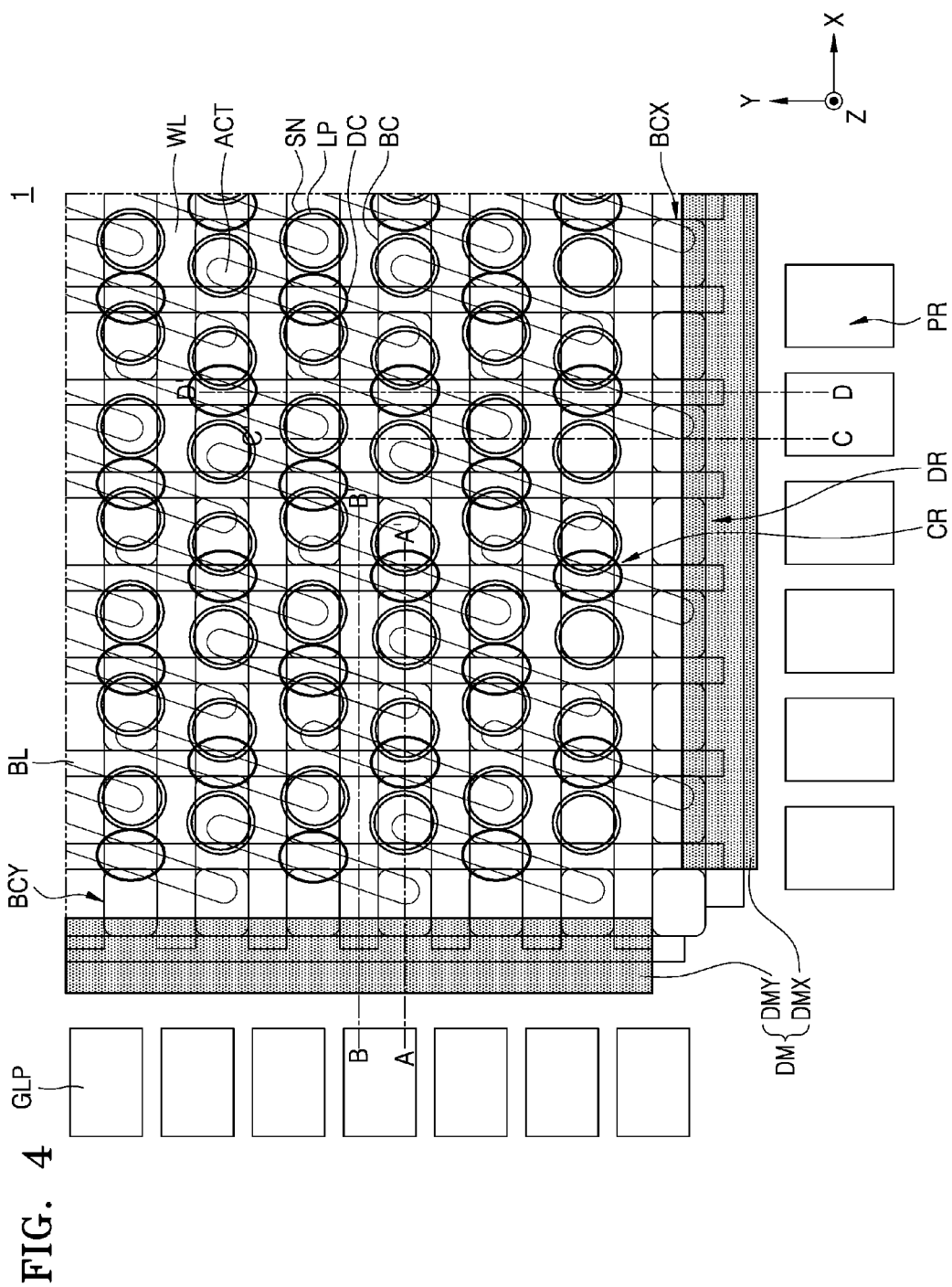
FIG. 4 is a schematic plan layout for describing main components of a semiconductor memory device, according to example embodiments.
Figure 5A:
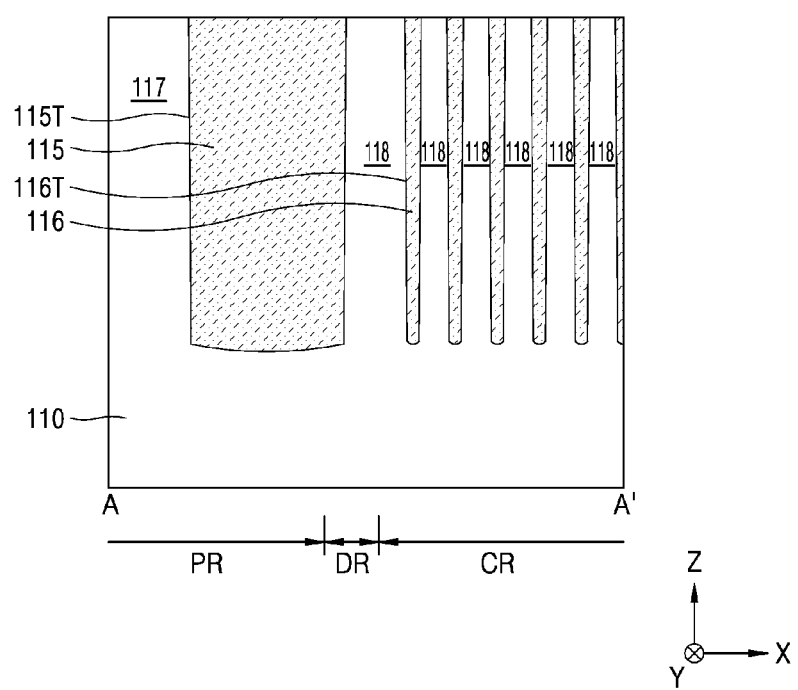
FIGS. 5A to 5D, 6A to 6D, 7A to 7D, 8A to 8D, 9A to 9D, and 10A to 10D are cross-sectional views of stages in a method of manufacturing a semiconductor memory device, according to example embodiments.
Figure 5B:
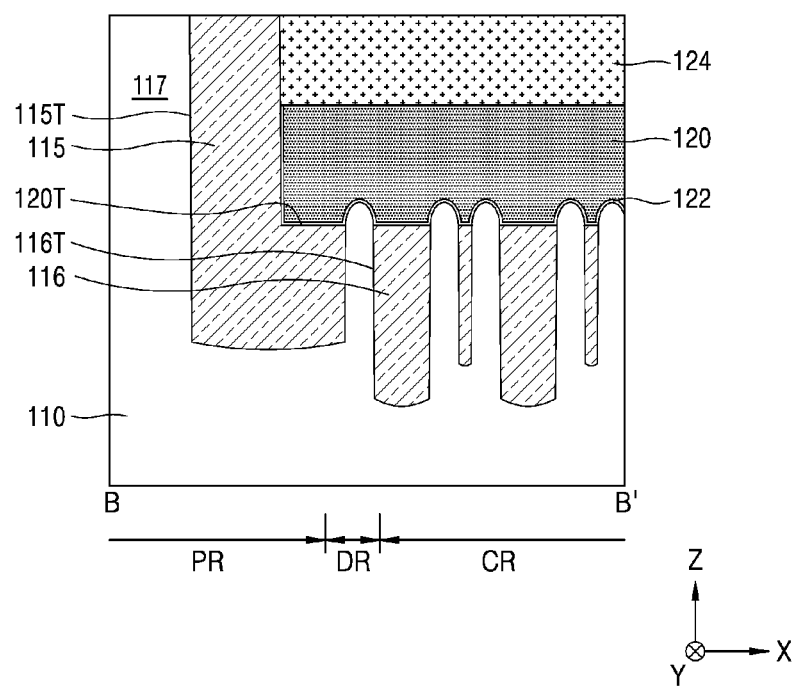
Figure 5C:
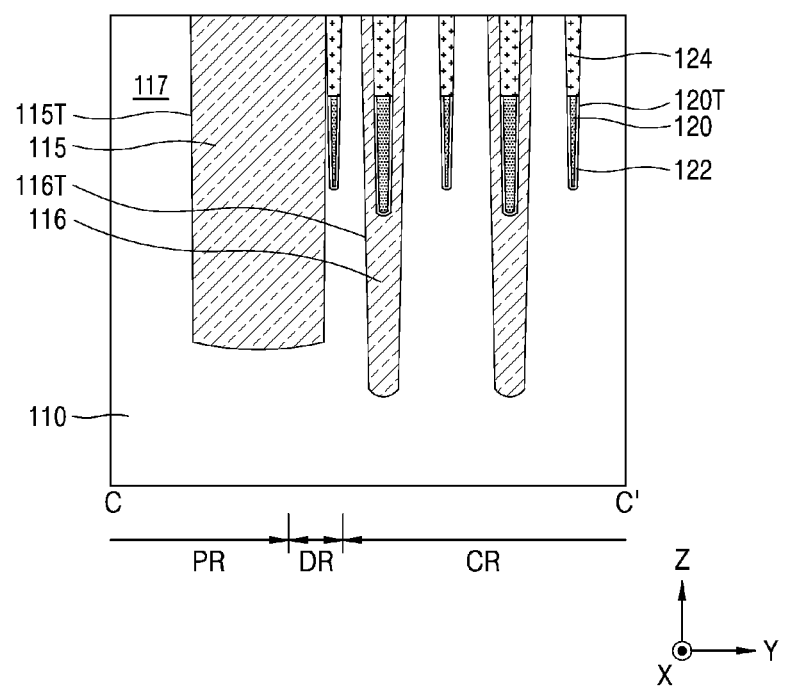
Figure 5D:
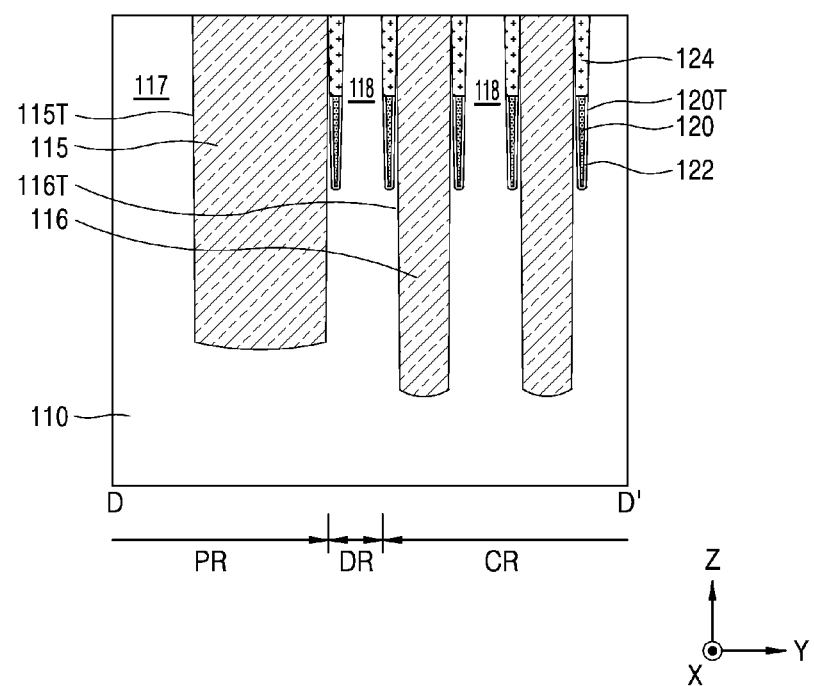
Figure 6A:
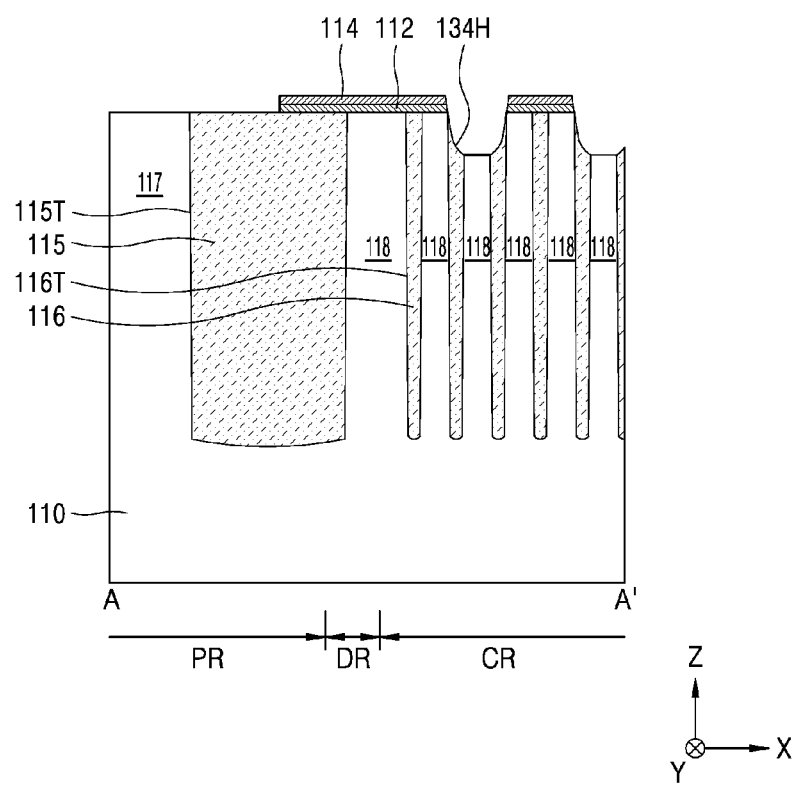
Figure 6B:
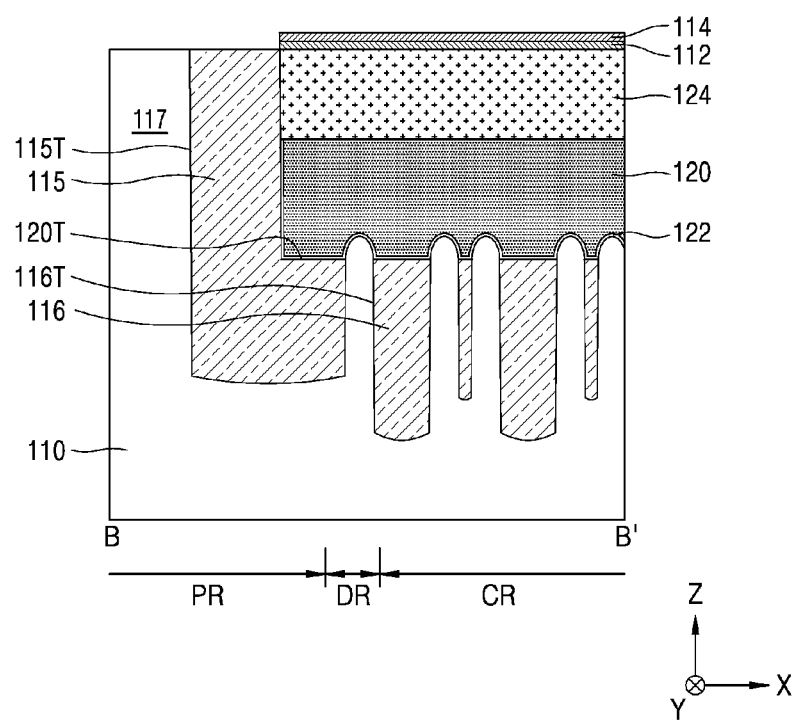
Figure 6C:
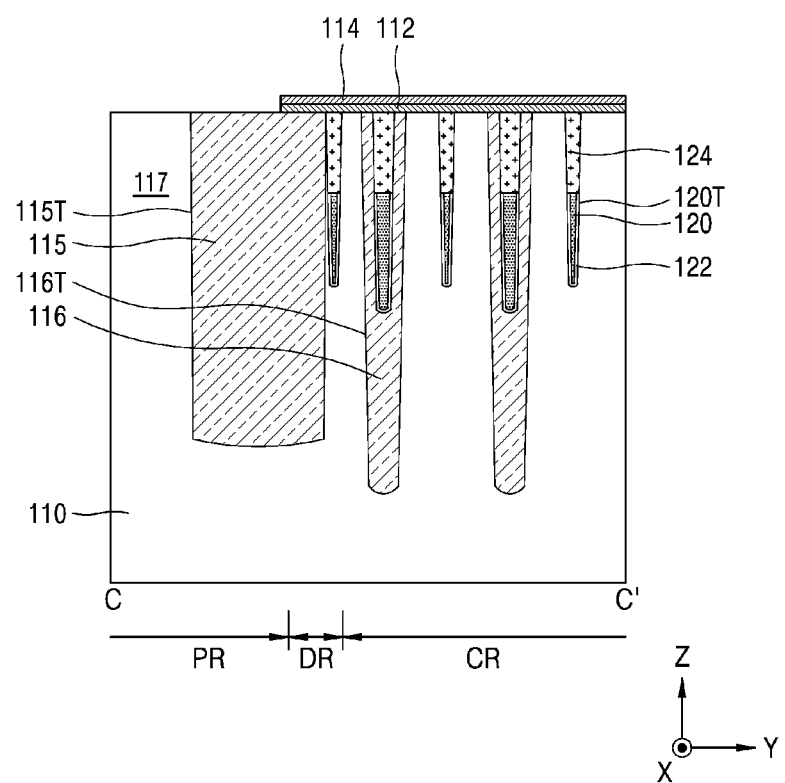
Figure 6D:
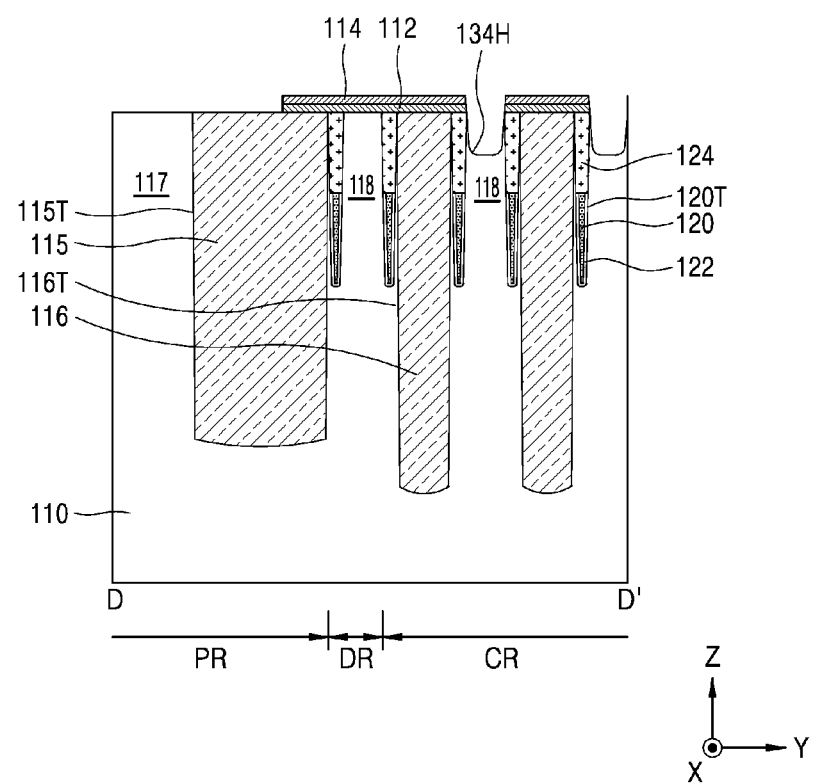

FIG. 4 is a schematic plan layout for describing main components of a semiconductor memory device, according to example embodiments.

Referring to FIG. 4, a semiconductor memory device 1 includes the memory cell region CR and the peripheral region PR. The dam structure DM may be arranged between the memory cell region CR and the peripheral region PR.

Although it is illustrated and described that the semiconductor memory device 1 of FIG. 4 has the dam structure DM of the semiconductor memory device 10 of FIG. 1, embodiments are not limited thereto. The semiconductor memory device 1 may have the dam structure DMa in FIG. 2 or the dam structure DMb in FIG. 3 instead of the dam structure DM in FIG. 1.

In some embodiments, the semiconductor memory device 1 may include a plurality of dam structures DM. The dam structures DM may include a first dam structure DMX, which has a longer line shape extending in the first horizontal direction (e.g., the X direction) along a side of the rectangular shape of the memory cell region CR, the side extending in the first horizontal direction (e.g., the X direction); and a second dam structure DMY, which has a longer line shape extending in the second horizontal direction (e.g., the Y direction) along a side of the rectangular shape of the memory cell region CR, the side extending in the second horizontal direction (e.g., the Y direction).

When the semiconductor memory device 1 have the dam structure DM in FIG. 1, the first dam structure DMX may be separated from the second dam structure DMY. When the semiconductor memory device 1 has the dam structure DMa in FIG. 2, there may be a plurality of first dam structures DMX and a plurality of second dam structures DMY, which may be separated from one another. When the semiconductor memory device 1 has the dam structure DMb in FIG. 3, the first dam structure DMX may be connected to the second dam structure DMY.

The semiconductor memory device 1 may include a plurality of active regions ACT in the memory cell region CR. In some embodiments, the active regions ACT may be arranged to have a long axis in a diagonal direction to the first horizontal direction (e.g., the X direction) and the second horizontal direction (e.g., the Y direction).

A plurality of word lines WL may extend in the first horizontal direction (e.g., the X direction) crossing the active regions ACT to be parallel with one another in the memory cell region CR. A plurality of bit lines BL may extend over the word lines WL in the second horizontal direction (e.g., the Y direction) crossing the first horizontal direction (e.g., the X direction) to be parallel with one another.

The bit lines BL may be connected to the active regions ACT through a direct contact DC.

In some embodiments, a plurality of buried contacts BC may be formed between two adjacent bit lines BL among the bit lines BL. In some embodiments, the buried contacts BC may be arranged in a line in the first horizontal direction (e.g., the X direction) and the second horizontal direction (e.g., the Y direction).

The buried contacts BC may include a plurality of first dummy buried contacts BCX and a plurality of second dummy buried contacts BCY. Herein, each dummy buried contact of the first and second dummy buried contacts BCX and BCY is a structure formed at the same level as each of the buried contacts BC (e.g., a level of the top surface of the dummy buried contact is the same as a level of the top surface of the buried contact) and adjacent to the buried contacts BC. Among the buried contacts BC, some adjacent to the first dam structure DMX may be the first dummy buried contacts BCX and some adjacent to the second dam structure DMY may be the second dummy buried contacts BCY. The first dummy buried contacts BCX may be arranged in one or at least two lines in the first horizontal direction (e.g., the X direction). The second dummy buried contacts BCY may be arranged in one or at least two lines in the second horizontal direction (e.g., the Y direction).

A plurality of landing pads LP may be formed above the buried contacts BC. The landing pads LP may at least partially overlap the buried contacts BC. In some embodiments, each of the landing pads LP may extend to above one of two bit lines BL adjacent thereto.

In some embodiments, the landing pads LP may not be formed above the first dummy buried contacts BCX and the second dummy buried contacts BCY among the buried contacts BC. In some embodiments, the landing pads LP may be formed above some of the first dummy buried contacts BCX and some of the second dummy buried contacts BCY but not above the others of the first dummy buried contacts BCX and the others of the second dummy buried contacts BCY. For example, when the first dummy buried contacts BCX are arranged in at least two lines in the first horizontal direction (e.g., the X direction), the landing pads LP may not be formed above some of the first dummy buried contacts BCX, which are arranged in one line in the first horizontal direction (e.g., the X direction) to be adjacent to the first dam structure DMX, but may be formed above the others of the first dummy buried contacts BCX. Similarly, when the second dummy buried contacts BCY are arranged in at least two lines in the second horizontal direction (e.g., the Y direction), the landing pads LP may not be formed above some of the second dummy buried contacts BCY, which are arranged in one line in the second horizontal direction (e.g., the Y direction) to be adjacent to the second dam structure DMY, but may be formed above the others of the second dummy buried contacts BCY.

A plurality of storage nodes SN may be formed above the landing pads LP. The storage nodes SN may be formed above the bit lines BL. Each of the storage nodes SN may be a lower electrode of a capacitor. The storage nodes SN may be connected to the active regions ACT through the landing pads LP and the buried contacts BC.

The dam structure DM may extend over some of the buried contacts BC in the first horizontal direction (e.g., the X direction) or the second horizontal direction (e.g., the Y direction). In some embodiments, the first dam structure DMX may extend over at least some of the first dummy buried contacts BCX in the first horizontal direction (e.g., the X direction). For example, the first dam structure DMX may extend over some of the first dummy buried contacts BCX in the first horizontal direction (e.g., the X direction), wherein some of the first dummy buried contacts BCX are adjacent to the edge of the memory cell region CR and arranged in one line in the first horizontal direction (e.g., the X direction). In some embodiments, the second dam structure DMY may extend over at least some of the second dummy buried contacts BCY in the second horizontal direction (e.g., the Y direction). For example, the second dam structure DMY may extend over some of the second dummy buried contacts BCY in the second horizontal direction (e.g., the Y direction), wherein some of the second dummy buried contacts BCY are adjacent to the edge of the memory cell region CR and arranged in one line in the second horizontal direction (e.g., the Y direction).

The gate line patterns GLP may be arranged in the peripheral region PR. For convenience of illustration, other components than the gate line patterns GLP are omitted from the peripheral region PR. The gate line patterns GLP may extend away from the memory cell region CR, but embodiments are not limited thereto. The shape of the gate line patterns GLP in FIG. 4 is just an example, and the gate line patterns GLP may have various widths or a curve or extend in various horizontal directions with a variable width.

The gate line patterns GLP may be formed at the same level as the bit lines BL. In some embodiments, the gate line patterns GLP and the bit lines BL may include the same materials or at least partially include the same materials. For example, a process of forming the whole or a portion of the gate line patterns GLP may be the same as the whole or a portion of a process of forming the bit lines BL.

FIGS. 5A to 5D, 6A to 6D, 7A to 7D, 8A to 8D, 9A to 9D, and 10A to 10D are cross-sectional views of stages in a method of manufacturing a semiconductor memory device, according to example embodiments. For example, FIGS. 5A, 6A, 7A, 8A, 9A, and 10A are cross-sectional views of the stages taken along line A-A' in FIG. 4; FIGS. 5B, 6B, 7B, 8B, 9B, and 10B are cross-sectional views of the stages taken along line B-B' in FIG. 4; FIGS. 5C, 6C, 7C, 8C, 9C, and 10C are cross-sectional views of the stages taken along line C-C' in FIG. 4; and FIGS. 5D, 6D, 7D, 8D, 9D, and 10D are cross-sectional views of the stages taken along line D-D' in FIG. 4.

Referring to FIGS. 5A through 5D, a substrate 110 including the memory cell region CR and the peripheral region PR is prepared. The substrate 110 may also include the dam region DR between the memory cell region CR and the peripheral region PR.

Although it is illustrated that the memory cell region CR is separated from the peripheral region PR and a region between the memory cell region CR and the peripheral region PR is denoted as the dam region DR, embodiments are not limited thereto. For example, the substrate 110 may include the memory cell region CR and the peripheral region PR, which are demarcated and in contact with each other, and the dam region DR may be a region in which the dam structure DM in FIG. 4 is located along the border between the memory cell region CR and peripheral region PR.

For example, the substrate 110 may include silicon (Si), e.g., crystalline Si, polycrystalline Si, or amorphous Si. Alternatively, the substrate 110 may include a semiconductor element, e.g., germanium (Ge), or at least one compound semiconductor selected from silicon germanium (SiGe), silicon carbide (SiC), gallium arsenide (GaAs), indium arsenide (InAs), and indium phosphide (InP). The substrate 110 may have a silicon-on-insulator (SOI) structure. For example, the substrate 110 may include a buried oxide (BOX) layer. The substrate 110 may include a conductive region, e.g., an impurity-doped well or an impurity-doped structure.

A region isolation trench 115T may be formed in the substrate 110, and a region isolation film 115 filling the region isolation trench 115T may be formed. The region isolation film 115 may be arranged between the memory cell region CR and the peripheral region PR. A logic active region 117 may be defined by the region isolation film 115 in the peripheral region PR.

A device isolation trench 116T may be formed in the memory cell region CR of the substrate 110, and a device isolation film 116 filling the device isolation trench 116T may be formed. A plurality of active regions 118 may be defined by the device isolation film 116 in the memory cell region CR of the substrate 110. Like the active regions ACT in FIG. 4, the active regions 118 may have a relatively long island shape having a short axis and a long axis.

In some embodiments, the region isolation film 115 and the device isolation film 116 may be simultaneously formed. For example, the region isolation trench 115T and the device isolation trench 116T may be simultaneously formed by etching in the substrate 110, and then the region isolation film 115 filling the region isolation trench 115T and the device isolation film 116 filling the device isolation trench 116T may be simultaneously formed by vapor deposition. In some embodiments, the region isolation trench 115T and the device isolation trench 116T may be respectively formed by separate etching processes, and then the region isolation film 115 and the device isolation film 116 may be simultaneously formed by vapor deposition. In some embodiments, the region isolation trench 115T and the device isolation trench 116T may be respectively formed by separate etching processes, and the region isolation film 115 and the device isolation film 116 may be respectively formed by separate vapor deposition processes.

The region isolation film 115 and the device isolation film 116 may include a material including, for example, at least one selected from a silicon oxide film, a silicon nitride film, and a silicon oxynitride film.

In some embodiments, a logic device isolation film defining the logic active region 117 may be formed in the peripheral region PR of the substrate 110. In some embodiments, the logic device isolation film may be formed together with the region isolation film 115 and/or the device isolation film 116.

A plurality of word line trenches 120T may be formed in the memory cell region CR of the substrate 110. The word line trenches 120T may have line shapes, which extend in the first horizontal direction (e.g., the X direction) to be parallel with one another and are arranged at equal intervals across the active regions 118 in the second horizontal direction (e.g., the Y direction). As shown in the cross-section taken along line B-B', there may be a step on the bottom surface of the word line trenches 120T.

After a resultant structure including the word line trenches 120T is cleaned, a plurality of gate dielectric films 122, a plurality of word lines 120, and a plurality of buried insulating films 124 may be sequentially formed in the word line trenches 120T. The word lines 120 may form the word lines WL in FIG. 4.

The word lines 120 may fill inner lower portions of the word line trenches 120T, and the buried insulating films 124 may cover the word lines 120 and fill inner upper portions of the word line trenches 120T. Accordingly, the word lines 120 may have line shapes, which extend in the first horizontal direction (e.g., the X direction) to be parallel with one another and are arranged at equal intervals across the active regions 118 in the second horizontal direction (e.g., the Y direction). Similarly, the buried insulating films 124 may have line shapes, which extend in the first horizontal direction (e.g., the X direction) to be parallel with one another and are arranged at equal intervals across the active regions 118 in the second horizontal direction (e.g., the Y direction).

For example, the word lines 120 may include Ti, TiN, Ta, TaN, W, WN, TiSiN, WSiN, or a combination thereof.

The gate dielectric films 122 may include at least one selected from a silicon oxide film, a silicon nitride film, a silicon oxynitride film, oxide/nitride/oxide (ONO), and a high-k dielectric film having a higher dielectric constant than the silicon oxide film. For example, the gate dielectric films 122 may have a dielectric constant of about 10 to about 25.

The top surfaces of the buried insulating films 124 may be substantially at the same level as the top surface of the substrate 110. The buried insulating films 124 may include a material film selected from a silicon oxide film, a silicon nitride film, a silicon oxynitride film, and a combination thereof.

The top surfaces of the word lines 120 may be at a lower level than the top surface of the logic active region 117 in the substrate 110. The bottom surfaces of the word lines 120 may have a rugged shape, and a transistor having a saddle fin structure, e.g., a saddle fin field effect transistor (FinFET), may be formed in the active regions 118.

In this specification, the term "level" refers to a height from the main surface or the top surface of the substrate 110 in the vertical direction (e.g., the Z direction). For example, "being at the same level" or "being at a certain level" refers to "having the same height from the main surface of the substrate 110 in the vertical direction (e.g., the Z direction)" or "being at a certain position", and "being at a low/high level" refers to "being at a low/high position with respect to the main surface of the substrate 110 in the vertical direction (e.g., the Z direction)". For example, the main surface or the top surface of the substrate 110 may be located at between the substrate 110 and the logic active region 117 or between the substrate 110 and the active regions 118.

In some embodiments, before or after the word lines 120 are formed, impurity ions may be implanted into active regions 118 of the substrate 110, which are respectively at both sides of each of the word lines 120, thereby forming a source region and a drain region in the active regions 118.

Referring to FIGS. 6A through 6D, an insulating film pattern is formed to cover the substrate 110 having the region isolation film 115, the device isolation film 116, the logic active region 117, the active regions 118, and the buried insulating films 124. For example, the insulating film pattern may include a silicon oxide film, a silicon nitride film, a silicon oxynitride film, a metal dielectric film, or a combination thereof.

In some embodiments, the insulating film pattern may be formed by stacking a plurality of insulating films including a first insulating film pattern 112 and a second insulating film pattern 114. For example, the second insulating film pattern 114 may have a higher permittivity than the first insulating film pattern 112. In some embodiments, the first insulating film pattern 112 may include a silicon oxide film, and the second insulating film pattern 114 may include a silicon oxynitride film. In some embodiments, the first insulating film pattern 112 may include a nonmetal dielectric film, and the second insulating film pattern 114 may include a metal dielectric film.

A direct contact hole 134H is formed in the memory cell region CR to penetrate the first insulating film pattern 112 and the second insulating film pattern 114. The direct contact hole 134H may expose a source region in an active region 118. In some embodiments, the direct contact hole 134H may extend inside the active region 118, i.e., the source region.

The first and second insulating film patterns 112 and 114 covering the peripheral region PR may be at least partially removed such that the logic active region 117 may be exposed without being covered with the first and second insulating film patterns 112 and 114.

Referring to FIGS. 7A through 7D, a direct contact conductive layer is formed to fill the direct contact hole 134H and cover the first and second insulating film patterns 112 and 114. The direct contact conductive layer may include, for example, an epitaxial silicon layer or doped polysilicon.

Thereafter, a metal conductive layer and an insulating capping layer, which are for forming a bit line structure 140 and a gate line structure 140P, are sequentially formed to cover the first and second insulating film patterns 112 and 114 and the direct contact conductive layer. The metal conductive layer may have a stack structure, in which a first metal conductive layer and a second metal conductive layer are stacked. The metal conductive layer may have a conductive layer stack structure having a double-layer structure, but this is just an example and embodiments are not limited thereto. For example, the metal conductive layer may include a single layer or a stack structure including at least three layers.

In some embodiments, the first metal conductive layer may include a TiN or Ti—Si—N (TSN), and the second metal conductive layer may include tungsten (W) or W and tungsten silicide ($WSi_x$). In some embodiments, the first metal conductive layer may function as a diffusion barrier. In some embodiments, the insulating capping layer may include a silicon nitride film.

The first metal conductive layer, the second metal conductive layer, and the insulating capping layer are etched, thereby forming a plurality of bit lines 147 including a first metal conductive pattern 145 and a second metal conductive pattern 146, which have a line shape, in the memory cell region CR, a plurality of gate lines 147P including the first metal conductive pattern 145 and the second metal conductive pattern 146 in the peripheral region PR, and a plurality of insulating capping lines 148 in both the memory cell region CR and the peripheral region PR. The bit lines 147 including the first metal conductive pattern 145 and the second metal conductive pattern 146 in the memory cell region CR may form a plurality of memory cells of a memory cell array. The gate lines 147P including the first metal conductive pattern 145 and the second metal conductive pattern 146 in the peripheral region PR may form a plurality of logic transistors.

The bit line structure 140 in the memory cell region CR may include one bit line 147 and one insulating capping line 148 covering the bit line 147, and the gate line structure 140P in the peripheral region PR may include one gate line 147P and one insulating capping line 148 covering the gate line 147P. A gate insulating film pattern 142 may be arranged between the gate line 147P and the logic active region 117.

In some embodiments, each of the bit line structure 140 and the gate line structure 140P may further include a conductive semiconductor pattern 132 between the insulating film pattern including the first and second insulating film patterns 112 and 114 and the first metal conductive pattern 145. The conductive semiconductor pattern 132 may include doped polysilicon. In some embodiments, the conductive semiconductor pattern 132 may be omitted.

A plurality of bit line structures 140 including the bit lines 147 and the insulating capping lines 148 may extend in parallel with each other in the second horizontal direction (e.g., the Y direction) that is parallel with the main surface of the substrate 110.

A dummy bit line structure 140D, which includes the bit lines 147 and the insulating capping lines 148 like the bit line structures 140, may extend in the second horizontal direction (e.g., the Y direction) along the dam region DR. In the first horizontal direction (e.g., the X direction), a width of the dummy bit line structure 140D may be greater than a width of each of the bit line structures 140, but embodiments are not limited thereto. In some embodiments, in the first horizontal direction (e.g., the X direction), the width of the dummy bit line structure 140D may be equal to the width of each bit line structure 140. Herein, dummy bit line structure 140D is a structure formed at the same level as the bit line structures 140 (e.g., a level of the top surface of the dummy bit line structure 140D is the same as a level of the top surface of each of the bit line structures 140) and adjacent to the bit line structures 140.

The dummy bit line structure 140D may include the same layers (e.g., the bit lines 147 and the insulating capping lines 148) forming such bit line structures 140. In some examples, the dummy bit line structure 140D may be simultaneously formed with the bit line structures 140 with the same processes that form the metal conductive layer and the insulating capping layer forming the bit line structures 140. The dummy bit line structure 140D in the semiconductor memory device 1 does not serve as an external terminal to cause transmission of a signal to an external device, for example, a memory controller (not shown).

The dummy bit line structure 140D may be formed only in the dam region DR extending in the second horizontal direction (e.g., the Y direction), i.e., the dam region DR in which the second dam structure DMY is arranged in FIG. 4, but not in the dam region DR extending in the first horizontal direction (e.g., the X direction), i.e., the dam region DR in which the first dam structure DMX is arranged in FIG. 4.

The bit lines 147 may form the bit lines BL illustrated in FIG. 4. The gate lines 147P may form the gate line patterns GLP illustrated in FIG. 4.

During an etching process of forming the bit lines 147, portions of the direct contact conductive layer that does not vertically overlap the bit lines 147 may also be etched, thereby forming a plurality of direct contact conductive patterns 134. At this time, the insulating film pattern (including the first and second insulating film patterns 112 and 114) may function as an etch stop layer during the etching process of forming the bit lines 147 and the direct contact conductive patterns 134. The direct contact conductive patterns 134 may form the direct contacts DC illustrated in FIG. 4. The bit lines 147 may be electrically connected to the plurality of active regions 118 through the direct contact conductive patterns 134.

In some embodiments, the conductive semiconductor pattern 132 may also be formed during a process of removing the portions of the direct contact conductive layer to form the direct contact conductive patterns 134. For example, the conductive semiconductor pattern 132 may be a portion of the direct contact conductive layer that vertically overlaps a bit line 147 but does not vertically overlap the direct contact hole 134H and is located on the insulating film pattern (including the first and second insulating film patterns 112 and 114), and the direct contact conductive patterns 134 may be a portion of the direct contact conductive layer that vertically overlaps the direct contact hole 134H and is in contact with an active region 118.

An insulating spacer structure 150 may cover each of opposite side walls of the bit line structure 140. The insulating spacer structure 150 may include a first insulating spacer 152, a second insulating spacer 154, and a third insulating spacer 156. The second insulating spacer 154 may include a material that has a lower permittivity than the first insulating spacer 152 and the third insulating spacer 156. In some embodiments, the first insulating spacer 152 and the third insulating spacer 156 may include a nitride film, and the second insulating spacer 154 may include an oxide film. In some embodiments, the first insulating spacer 152 and the third insulating spacer 156 may include a nitride film, and the second insulating spacer 154 may include a material that has an etch selectivity with respect to the first insulating spacer 152 and the third insulating spacer 156. For example, when the first insulating spacer 152 and the third insulating spacer 156 include a nitride film, the second insulating spacer 154 may include an oxide film and may be removed during a subsequent process to be an air spacer.

A side wall of the gate line structure 140P may be covered with a gate insulating spacer 150P. The gate insulating spacer 150P may include, for example, a nitride film. In some embodiments, the gate insulating spacer 150P may include a single layer but not limited thereto. The gate insulating spacer 150P may include a stack structure including at least two layers.

A buried contact hole 170H may be formed between two adjacent bit lines 147. The inner space of the buried contact hole 170H may be defined by insulating spacer structures 150 respectively covering respective side walls of the two adjacent bit lines 147 and an active region 118 between the two adjacent bit lines 147.

A plurality of buried contact holes 170H may be formed by partially removing the insulating film pattern (including the first and second insulating film patterns 112 and 114) and the active regions 118 in the memory cell region CR using, as etching masks, the insulating capping lines 148 and a plurality of insulating spacer structures 150 each covering one of opposite side walls of each of the bit line structures 140. The buried contact holes 170H may be formed by performing an anisotropic etching process of partially removing the insulating film pattern (including the first and second insulating film patterns 112 and 114) and the active regions 118 using, as etching masks, the insulating capping lines 148 and the insulating spacer structures 150 each covering one of opposite side walls of each of the bit line structures 140 and then performing an isotropic etching process of further removing a portion of each of the active regions 118 such that the space of each of the buried contact holes 170H, which is defined by an active region 118, may be extended.

Figure 7A:
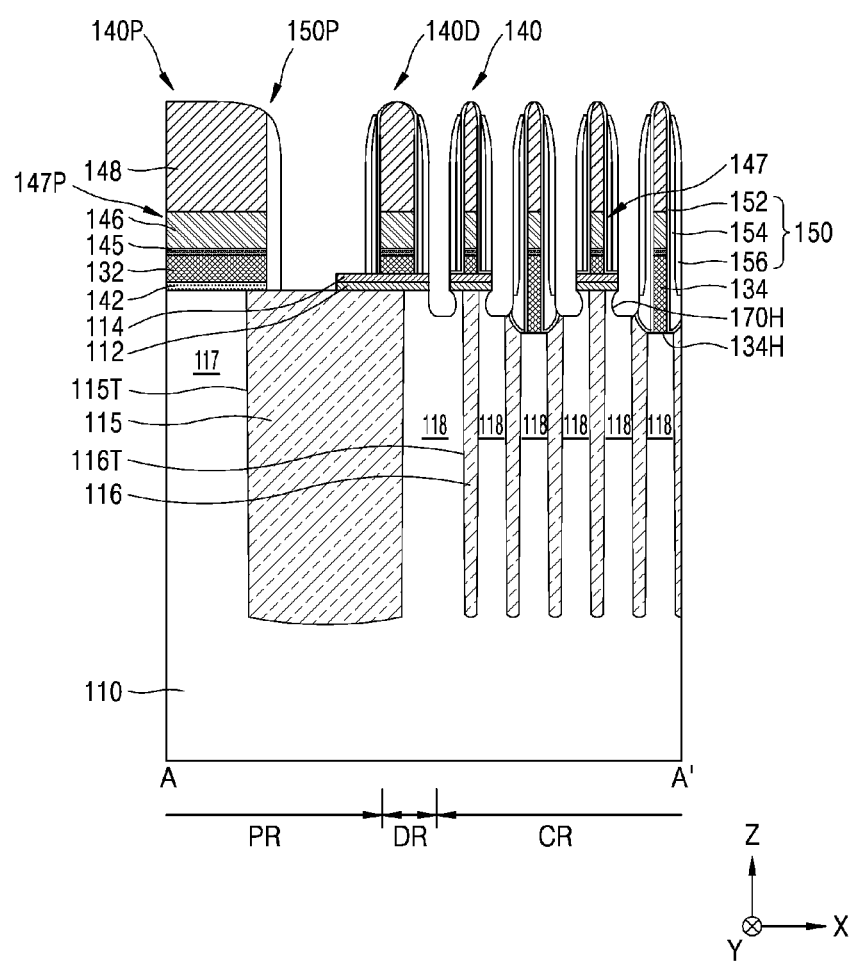
Figure 7B:
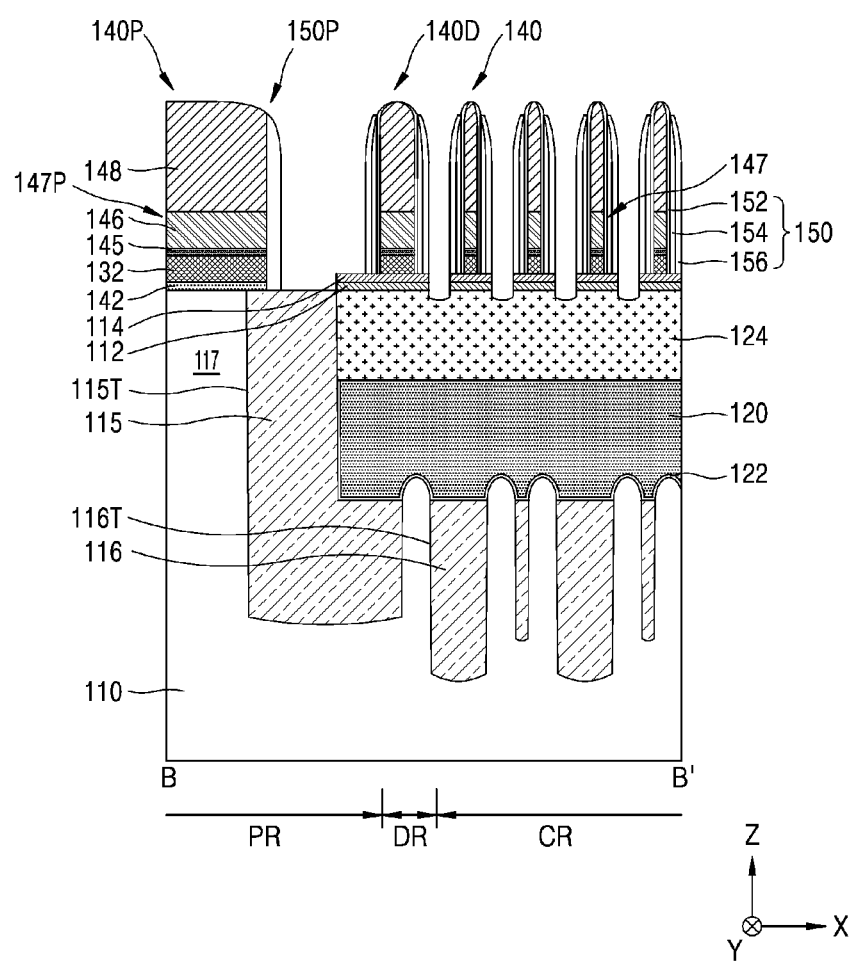
Figure 7C:
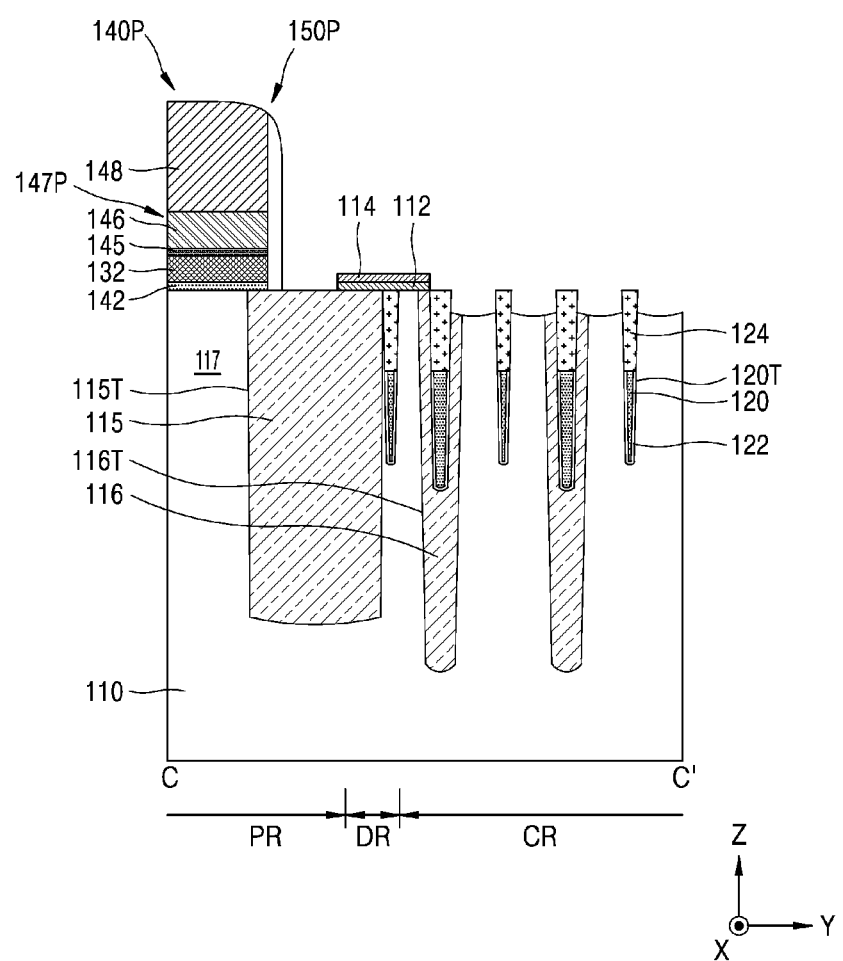
Figure 7D:
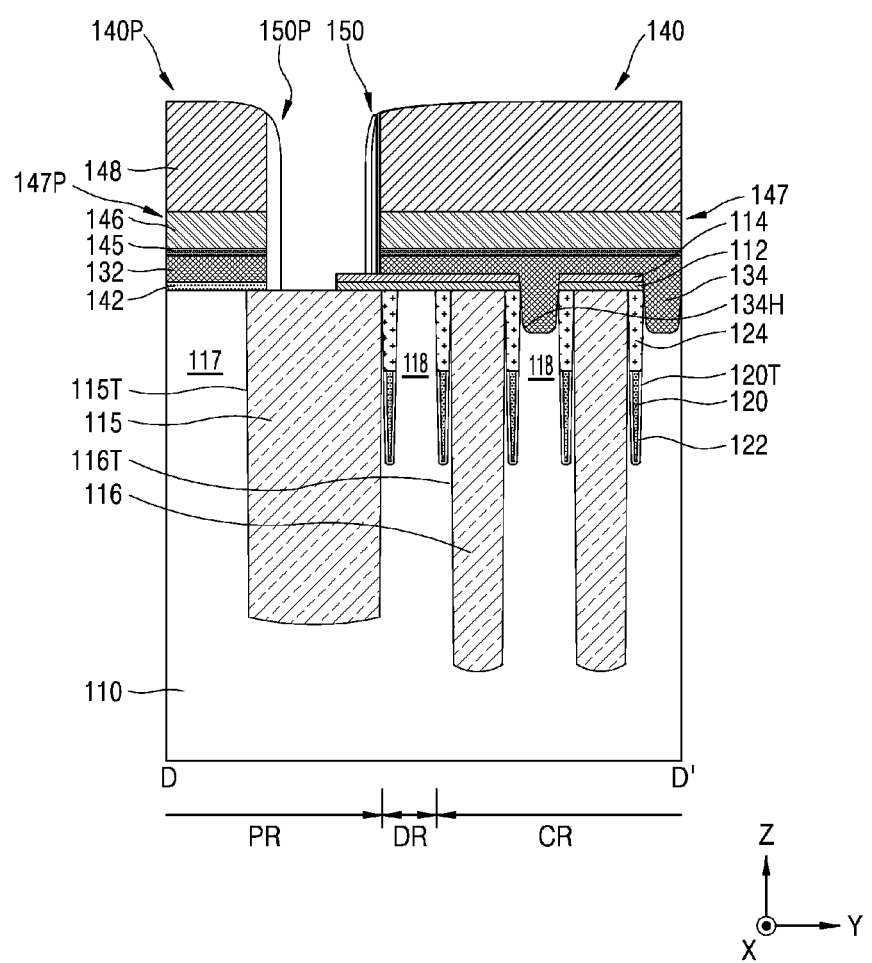
Figure 8A:
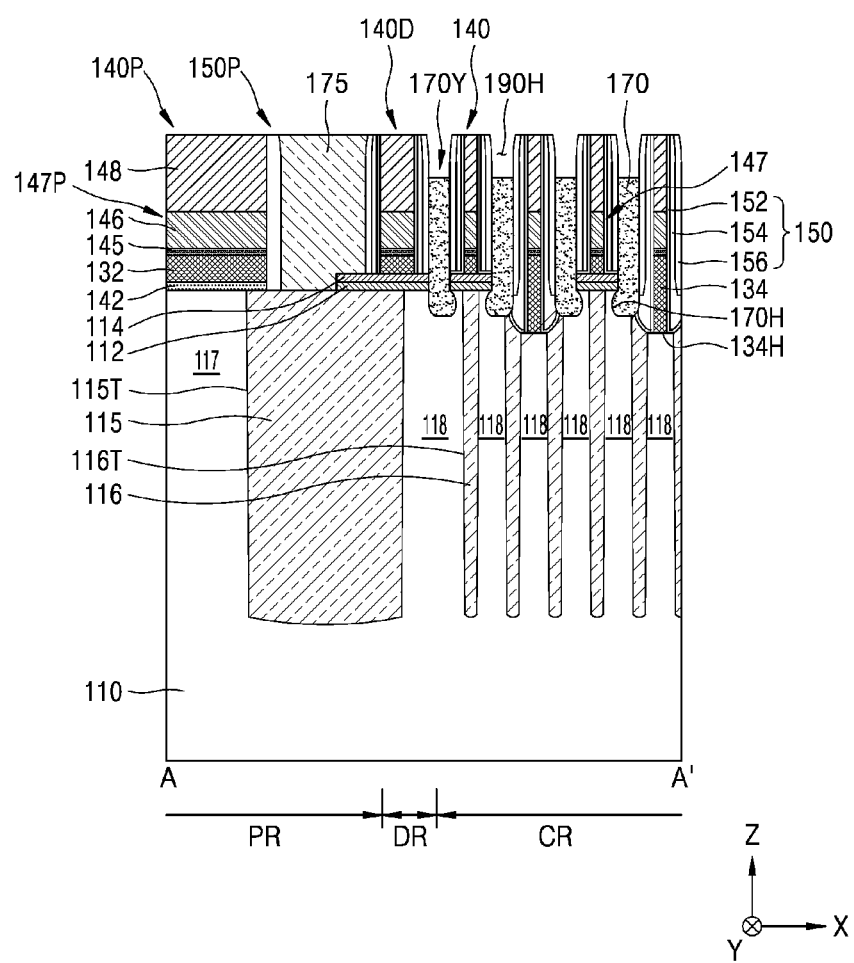
Figure 8B:
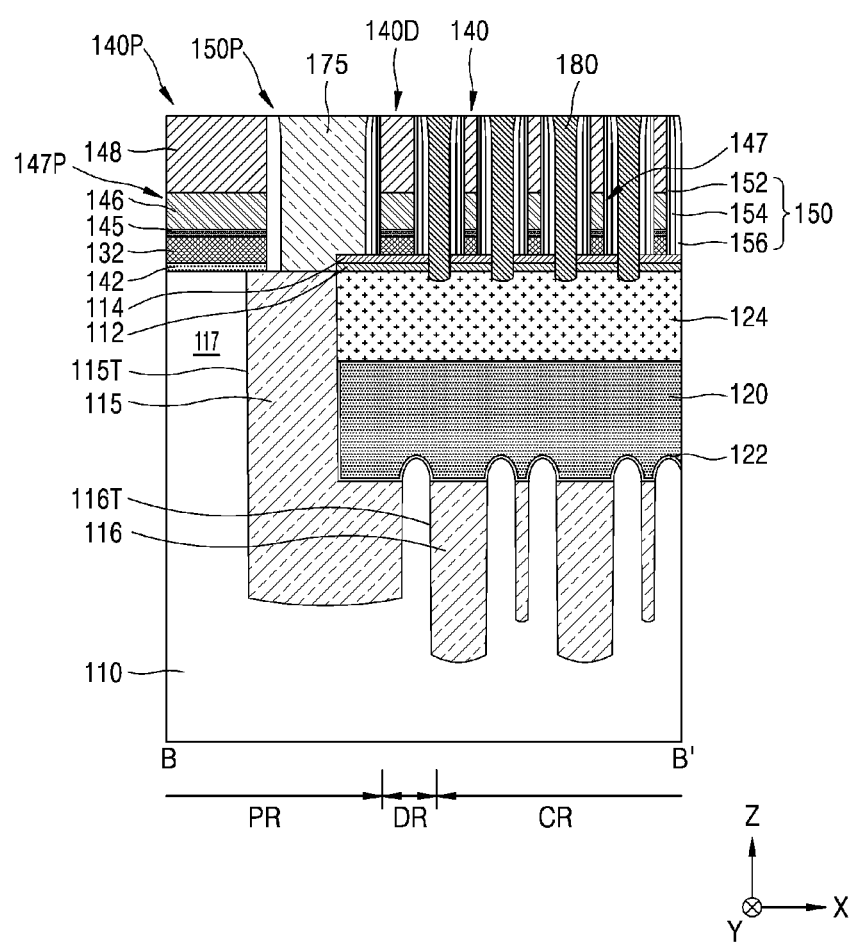
Figure 8C:
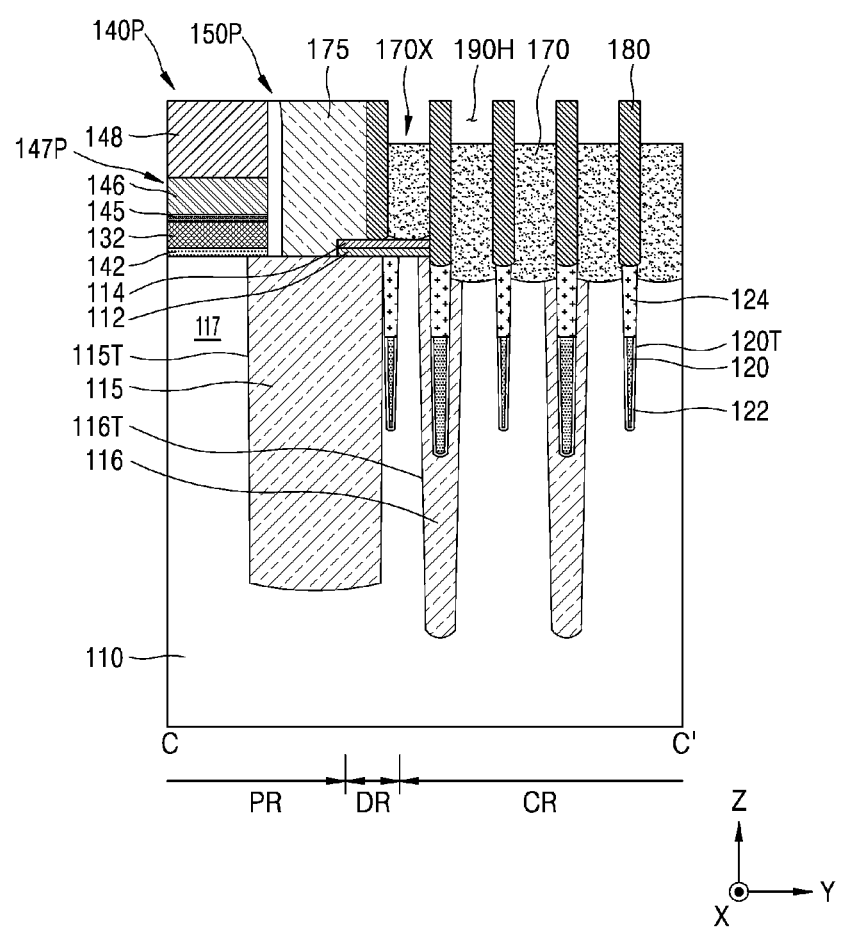
Figure 8D:
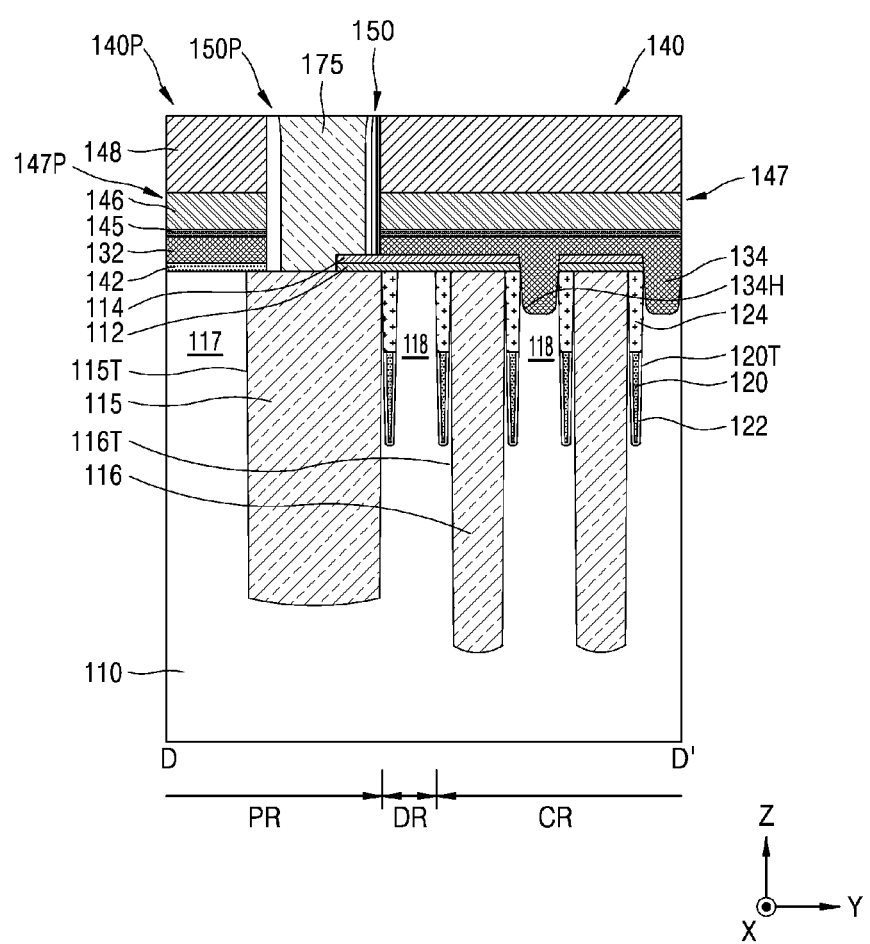
Figure 9A:
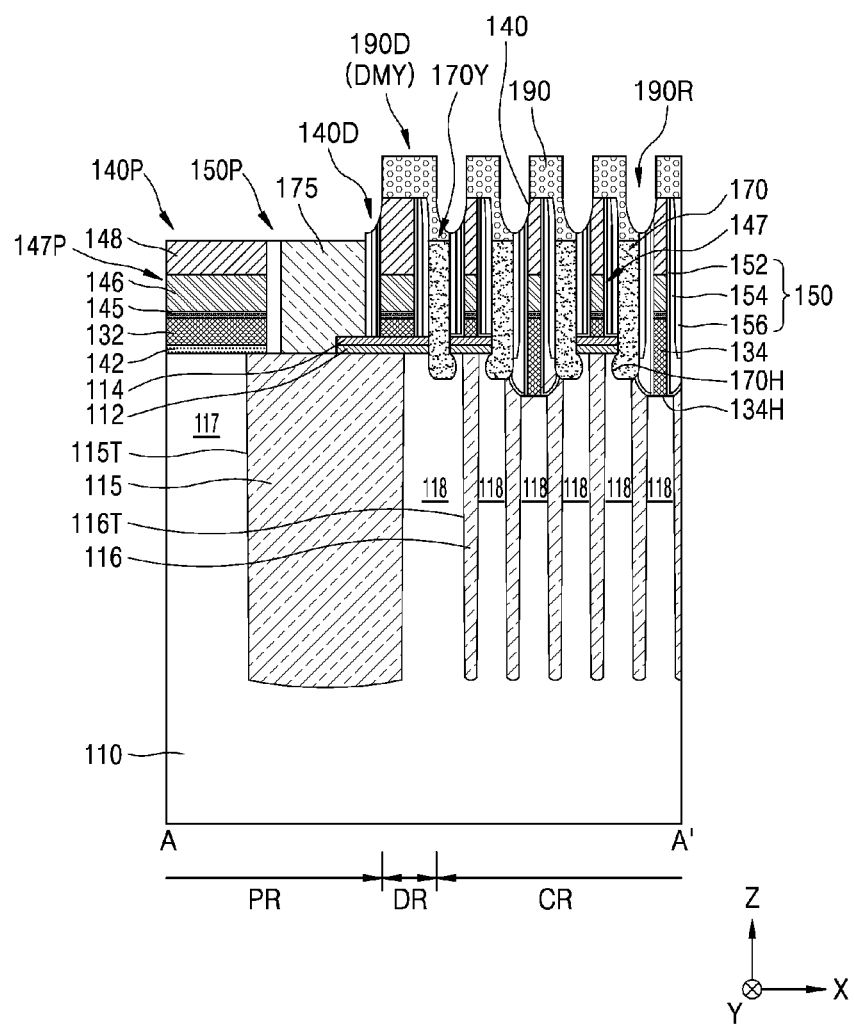
Figure 9B:
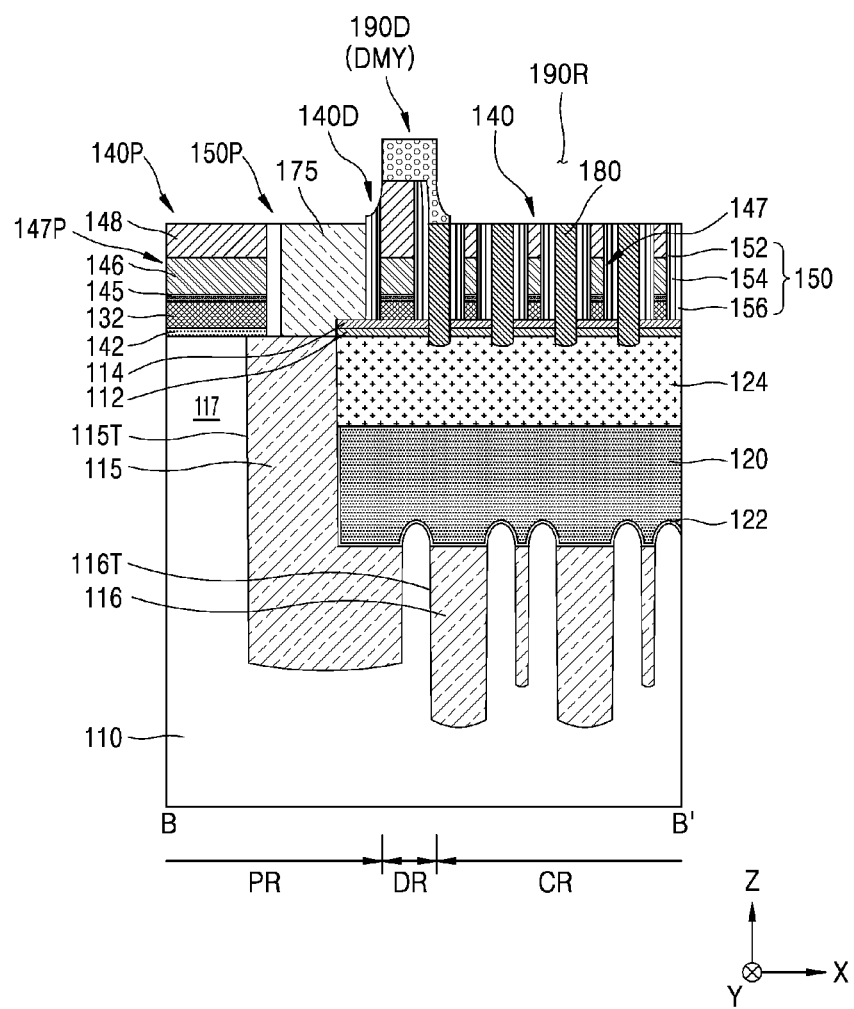
Figure 9C:
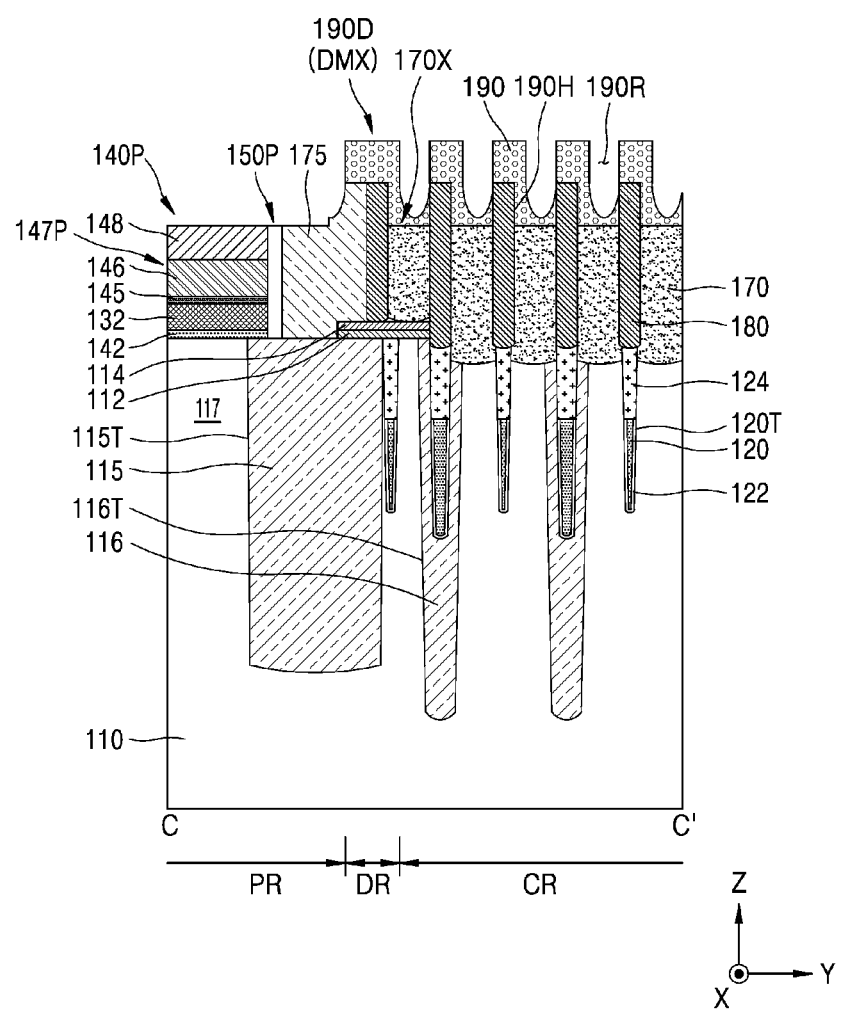
Figure 9D:
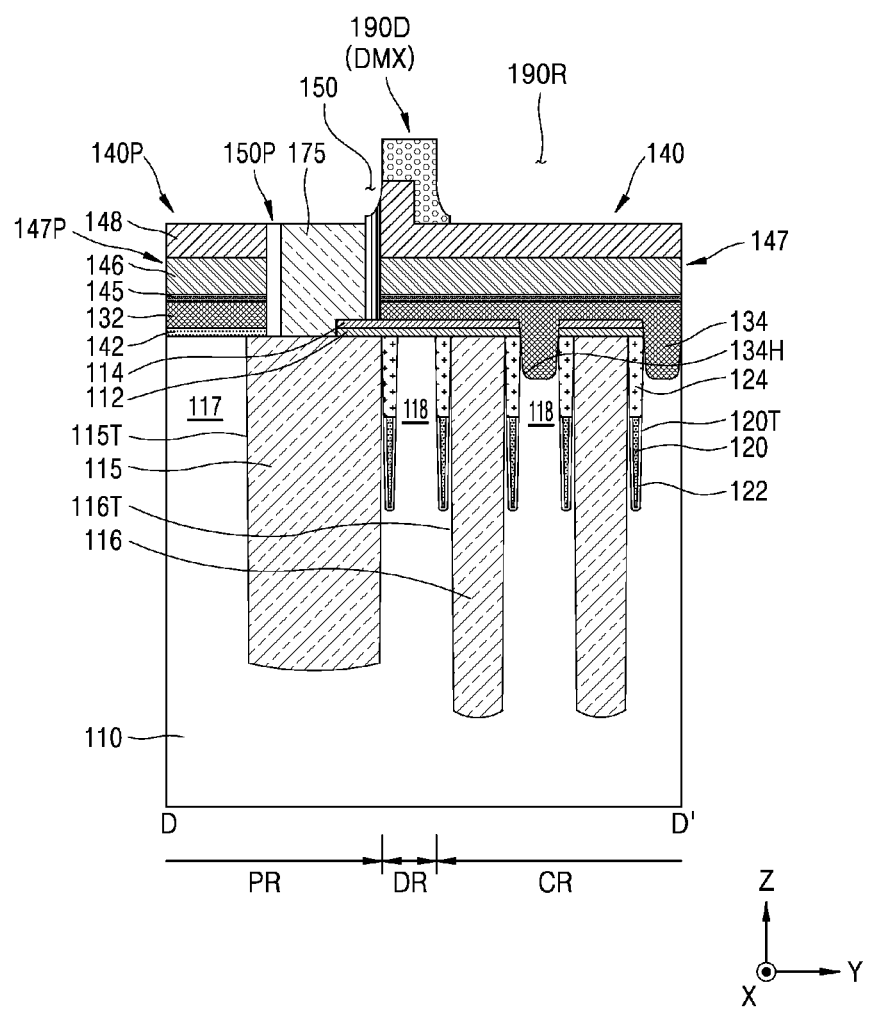
Figure 10A:
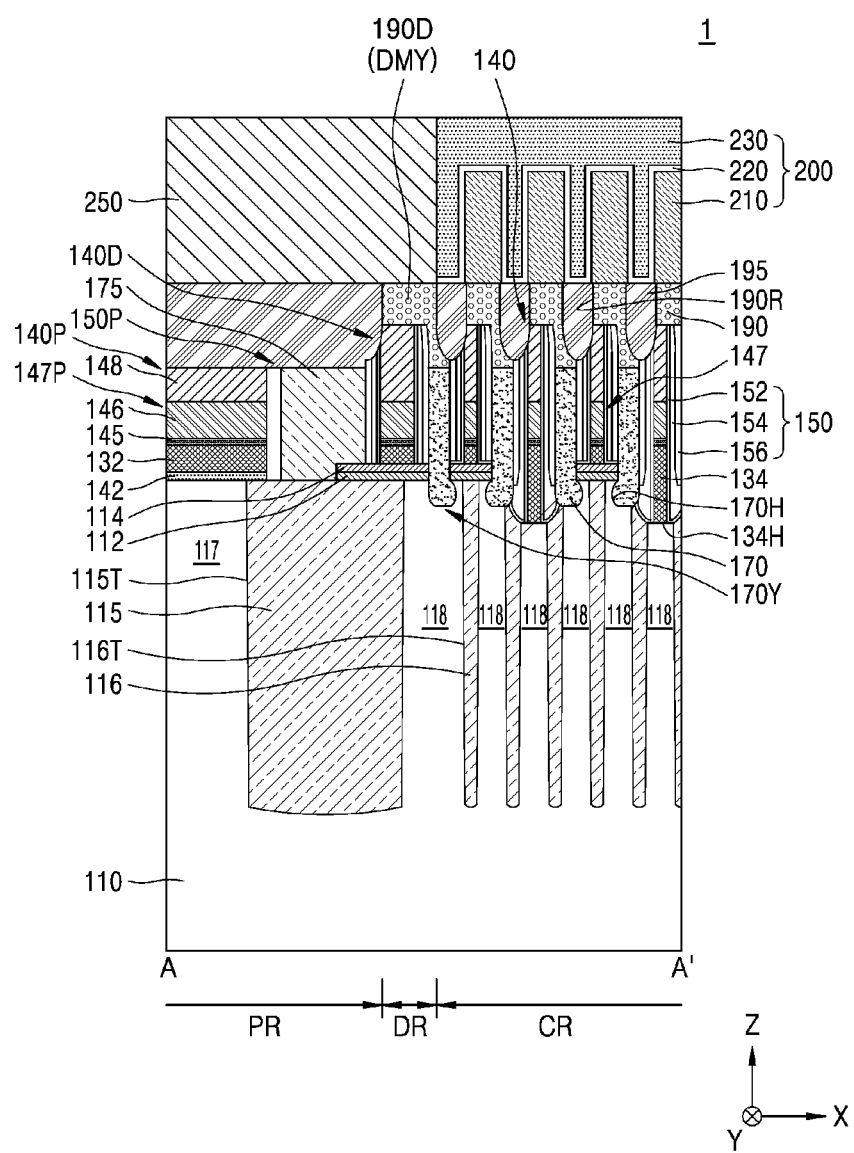
Figure 10B:
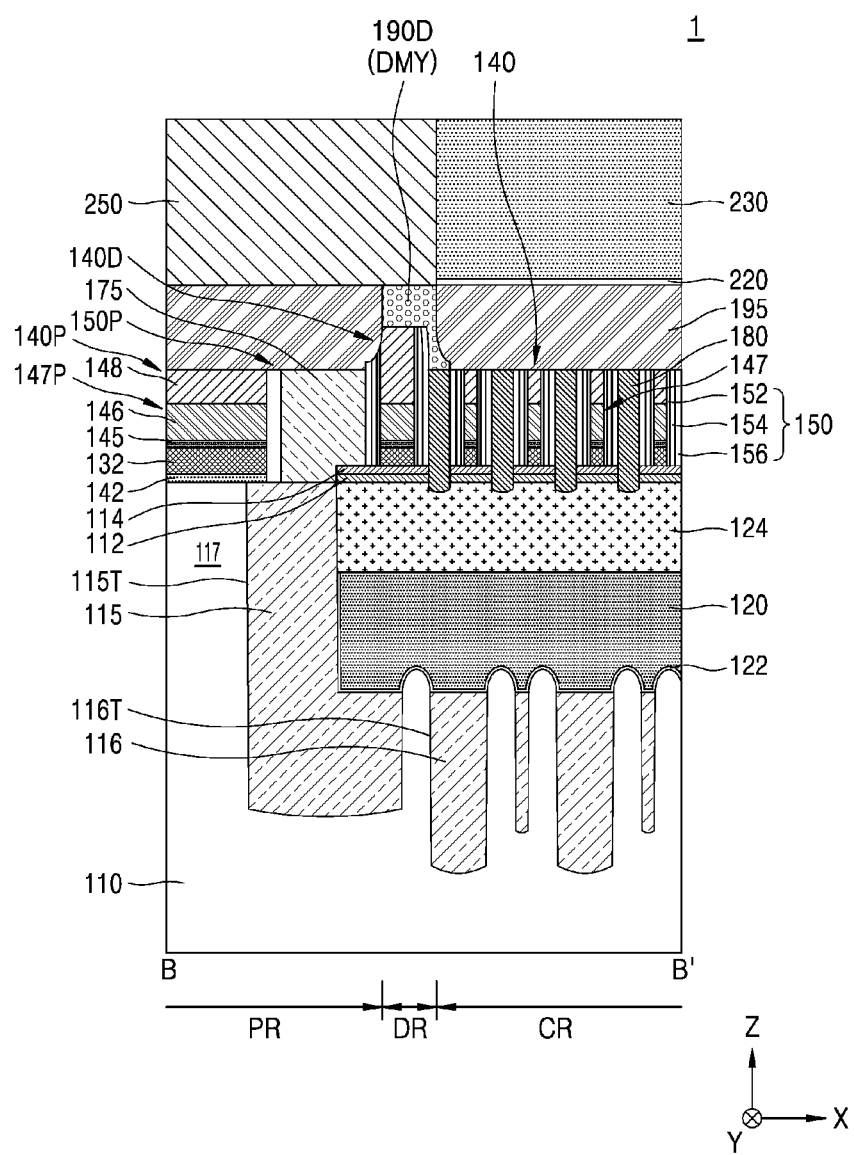
Figure 10C:
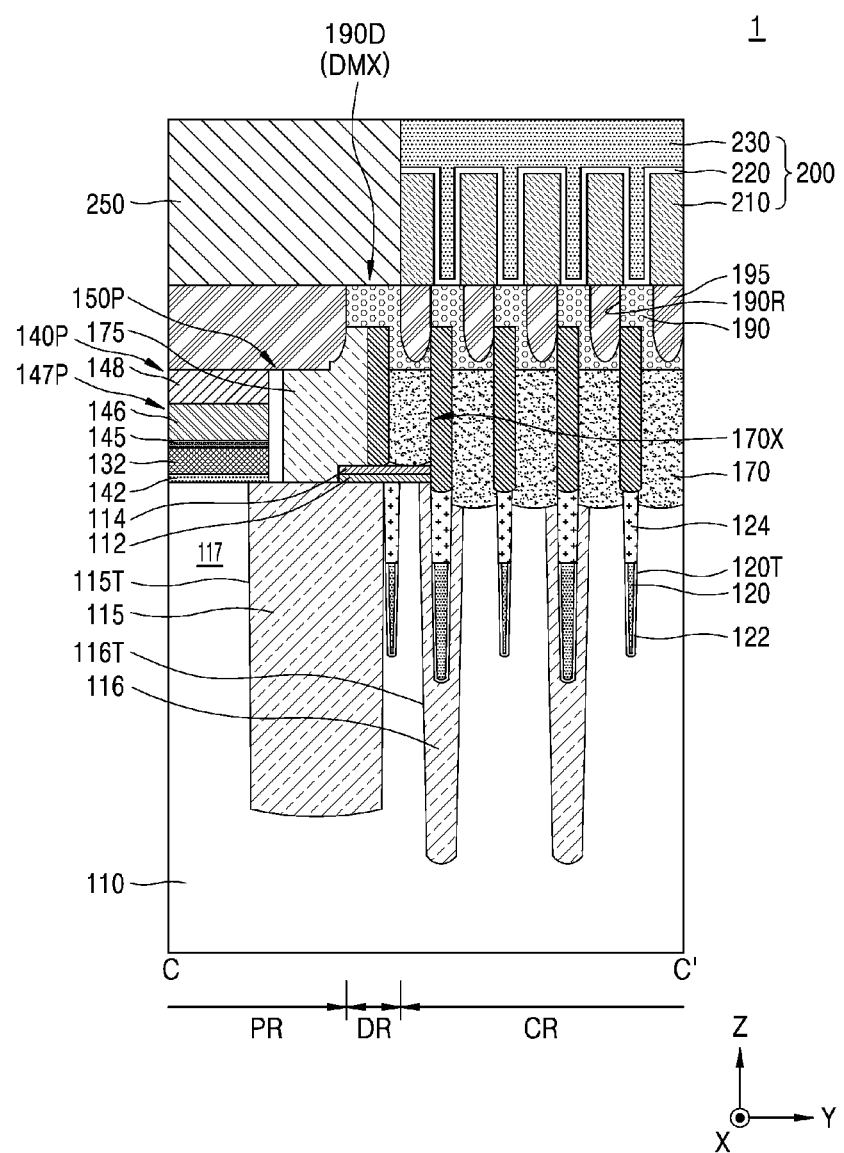
Figure 10D:
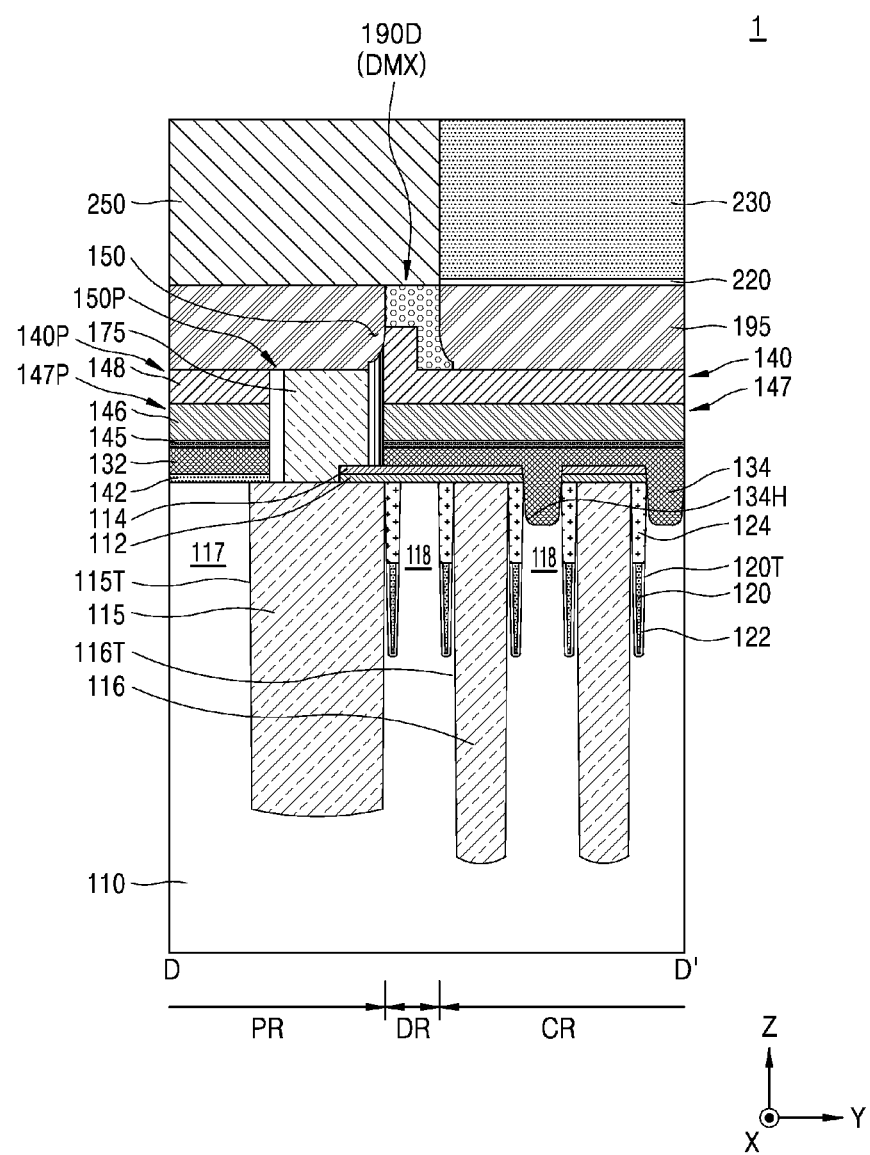

In some embodiments, as shown in FIG. 7C, portions of the insulating film pattern (including the first and second insulating film patterns 112 and 114) and the active region 118 in a portion of the memory cell region CR may not be removed but remain, wherein the portion of the memory cell region CR is adjacent to the dam region DR, and more particularly, to the dam region DR, in which the first dam structure DMX in FIG. 4 is arranged. For example, a portion of the insulating film pattern (including the first and second insulating film patterns 112 and 114), which covers the active region 118 between two buried insulating films 124 adjacent to the dam region DR in which the first dam structure DMX in FIG. 4 is arranged, may not be removed but remain. For example, a mask layer may be formed to cover the peripheral region PR, the dam region DR, and a portion of the memory cell region CR adjacent to the dam region DR, and then the insulating film pattern (including the first and second insulating film patterns 112 and 114) and the active regions 118 may be partially removed using, as etching masks, the mask layer, the insulating capping lines 148, and the insulating spacer structures 150.

Referring to FIGS. 8A through 8D, a plurality of buried contacts 170 and a plurality of insulating fences 180 are formed in space among the insulating spacer structures 150 respectively covering the side walls of the bit line structures 140 in the memory cell region CR. A plurality of buried contacts 170 and a plurality of insulating fences 180 may be alternately arranged between two adjacent insulating spacer structures 150 among the insulating spacer structures 150, which respectively cover the side walls of the bit line structures 140, in the second horizontal direction (e.g., the Y direction).

For example, the buried contacts 170 may include polysilicon. For example, the insulating fences 180 may include a nitride film.

In some embodiments, a plurality of buried contacts 170 may be arranged in lines in the first horizontal direction (e.g., the X direction) and the second horizontal direction (e.g., the Y direction). Each of the buried contacts 170 may extend from an active region 118 in the vertical direction (e.g., the Z direction) perpendicular to the substrate 110. The buried contacts 170 may form the buried contacts BC illustrated in FIG. 4.

The buried contacts 170 may be arranged in spaces defined by the insulating fences 180 and the insulating spacer structures 150 respectively covering the side walls of the bit line structures 140.

The buried contacts 170 may be formed by forming a preliminary buried contact material layer filling the buried contact holes 170H and removing an upper portion of the preliminary buried contact material layer. For example, the preliminary buried contact material layer may include polysilicon.

The top surfaces of the buried contacts 170 may be at a lower level than the top surfaces of the insulating capping lines 148. The top surfaces of the insulating fences 180 may be at the same level as the top surfaces of the insulating capping lines 148 in the vertical direction (e.g., the Z direction). Accordingly, the top surfaces of the buried contacts 170 may be at a lower level than the top surfaces of the insulating fences 180.

The buried contacts 170 may include a plurality of first dummy buried contacts 170X and a plurality of second dummy buried contacts 170Y. The first dummy buried contacts 170X may form the first dummy buried contacts BCX in FIG. 4, and the second dummy buried contacts 170Y may form the second dummy buried contacts BCY in FIG. 4. The first and second dummy buried contacts 170X and 170Y include the same conductive layers (e.g., polysilicon) forming such buried contacts 170. For example, the first and second dummy buried contacts 170X and 170Y may be simultaneously formed with the buried contacts 170 with the same processes that deposit and pattern the conductive layers forming the buried contacts 170. Each dummy buried contact of the first and second dummy buried contacts 170X and 170Y in the semiconductor memory device 1 does not serve as an external terminal to cause transmission of a signal to an external device, for example, a memory controller (not shown).

In some embodiments, the first dummy buried contacts 170X may be formed on the insulating film pattern (including the first and second insulating film patterns 112 and 114). For example, the first dummy buried contacts 170X may be separated from the active regions 118 with the insulating film pattern (including the first and second insulating film patterns 112 and 114) between the first dummy buried contacts 170X and the active regions 118. The first dummy buried contacts 170X may be electrically insulated (or, separated) from the active regions 118 by the insulating film pattern (including the first and second insulating film patterns 112 and 114). In some embodiments, the second dummy buried contacts 170Y may be formed on the active regions 118. For example, the second dummy buried contacts 170Y may be in contact with the active regions 118. The second dummy buried contacts 170Y may be electrically connected to the active regions 118.

A plurality of landing pad holes 190H may be defined by the insulating spacer structures 150 and the insulating fences 180. The buried contacts 170 may be exposed at the bottoms of the landing pad holes 190H.

In some embodiments, after the insulating fences 180 are formed, the preliminary buried contact material layer may be formed. In some embodiments, after the preliminary buried contact material layer is formed, the insulating fences 180 may be formed.

The buried contacts 170 may fill lower portions of the spaces among the insulating spacer structures 150, which respectively cover the side walls of the bit line structures 140. In some embodiments, the top surfaces of the buried contacts 170 may be at a lower level than the top surfaces of the bit lines 147, but embodiments are not limited thereto.

During a process of forming the buried contacts 170 and the insulating fences 180, a first filling insulating layer 175 may cover the peripheral region PR. In the process of forming the buried contacts 170 and the insulating fences 180, an upper portion of the first filling insulating layer 175 may be removed such that the top surface of the first filling insulating layer 175 may be at the same level as the top surface of the gate line structure 140P. The first filling insulating layer 175 may include, for example, an oxide film.

In the process of forming the buried contacts 170 and/or the insulating fences 180, an upper portion of an insulating capping line 148, which is included in each of a bit line structure 140, the dummy bit line structure 140D, and the gate line structure 140P, and an upper portion of each of the insulating spacer structures 150 may be removed such that the top surfaces of the bit line structure 140, the dummy bit line structure 140D, and the gate line structure 140P may be lowered.

Referring to FIGS. 9A through 9D, a plurality of landing pads 190 filling a plurality of landing pad holes 190H and extending over the bit line structures 140 are formed, and a dam structure 190D filling a plurality of landing pad holes 190H and extending over the dummy bit line structure 140D may be formed.

The landing pads 190 may be arranged on the buried contact 170 in the memory cell region (CR and may extend over the bit lines 147. The landing pads 190 may be arranged on and electrically connected to the buried contacts 170, respectively. Each of the landing pads 190 may be connected to an active region 118 through a buried contact 170. The landing pads 190 may form the landing pads LP illustrated in FIG. 4. The top surface of each of the landing pads 190 may have a disc shape that is substantially a circle not an oval.

The buried contact 170 may be between two adjacent bit line structures 140, and a landing pad 190 may extend from between the two adjacent bit line structures 140 to above one of the two adjacent bit line structures 140, wherein the two adjacent bit line structures 140 have the buried contact 170 therebetween. In other words, the landing pad 190 may extend from between the two adjacent bit line structures 140 to above one of the two adjacent bit line structures 140 and thus be electrically connected to the buried contact 170 and vertically overlap one bit line structure 140, wherein the two adjacent bit line structures 140 have the buried contact 170 therebetween.

The landing pads 190 may be formed by forming a landing pad material layer filling the landing pad holes 190H and covering the insulating capping lines 148 and the insulating fences 180 and then forming a recess 190R to separate the landing pad material layer into a plurality of portions respectively corresponding to the buried contacts 170. Two adjacent landing pads 190 may be separated from each other with the recess 190R therebetween. The recess 190R may expose a top end of an insulating spacer structure 150, a top end of an insulating capping line 148, and a top end of an insulating fence 180. In some embodiments, during a process of forming the recess 190R, upper portions of the insulating spacer structures 150, upper portions of the insulating capping lines 148, and upper portions of the insulating fences 180 may be removed.

In some embodiments, before the landing pads 190 are formed, a metal silicide film may be formed on the buried contacts 170. The metal silicide film may be arranged between the buried contacts 170 and the landing pads 190. The metal silicide film may include cobalt silicide ($CoSi_x$), nickel silicide ($NiSi_x$), or manganese silicide ($MnSi_x$) but is not limited thereto.

In some embodiments, the landing pads 190 may include a conductive barrier film and a conductive pad material layer on the conductive barrier film. For example, the conductive barrier film may include a metal, a conductive metal nitride, or a combination thereof. In some embodiments, the conductive barrier film may include a Ti/TiN stack structure. For example, the conductive pad material layer may include a metal. In some embodiments, the conductive pad material layer may include tungsten (W).

The dam structure 190D may be formed in the dam region DR. The dam structure 190D may be formed by separating a portion of the landing pad material layer to be located in the dam region DR. According to a top view, the dam structure 190D may have the shapes of the dam structures DM in FIGS. 1 through 3. For example, the dam structure 190D may have a line shape extending along a side of the rectangular shape of the memory cell region CR.

The dam structure 190D may include the first dam structure DMX extending in a longer line shape in the first horizontal direction (e.g., the X direction) and the second dam structure DMY extending in a longer line shape in the second horizontal direction (e.g., the Y direction).

The landing pads 190 and the dam structure 190D are formed from the landing pad material layer and may thus be at the same level. The top surface of the dam structure 190D may be at the same level as the top surfaces of the landing pads 190, and the bottom surface of the dam structure 190D may be at the same level as the bottom surfaces of the landing pads 190.

The dam structure 190D may be simultaneously formed with the landing pads 190 with the same process that fill the landing pad holes 190H forming the landing pads 190. The dam structure 190D in the semiconductor memory device 1 does not serve as an external terminal to cause transmission of a signal to an external device, for example, a memory controller (not shown).

A side of the top surface of the dam structure 190D, which faces the memory cell region CR, may have a straight line shape extending in the first horizontal direction (e.g., the X direction) or the second horizontal direction (e.g., the Y direction), without being influenced by the shapes of the top surfaces of landing pads 190 adjacent to the dam structure 190D. Because there is a relatively wide gap between the dam structure 190D and the landing pads 190, photoresist residues, etch by-products, or the like may be easily removed.

In some embodiments, the dam structure 190D may have a line shape extending in the first horizontal direction (e.g., the X direction) or the second horizontal direction (e.g., the Y direction) along one of four sides of the rectangular shape of the memory cell region CR such that the dam structure 190D has the dam opening DO in FIG. 1 or the dam opening DOa in FIG. 2. Photoresist residues, etch by-products, or the like, which may be generated in a process of separating the landing pad material layer into a plurality of portions to form the landing pads 190, may be discharged through the dam opening DO in FIG. 1 or the dam opening DOa in FIG. 2.

In some embodiments, the dam structure 190D may extend in the first horizontal direction (e.g., the X direction) or the second horizontal direction (e.g., the Y direction) and may have a rectangular shape surrounding the memory cell region CR.

In some embodiments, the dam structure 190D may be formed together with the landing pads 190 by a process of forming the recess 190R by partially removing the landing pad material layer. For example, the dam structure 190D may be separated from the landing pads 190 with the recess 190R between the dam structure 190D and the landing pads 190.

To form the recess 190R, a landing pad mask pattern corresponding to the landing pads 190 and a dam mask pattern corresponding to the dam structure 190D are formed on the landing pad material layer. The landing pad mask pattern and the dam mask pattern may be formed by, for example, EUV lithography. In some embodiments, the landing pad mask pattern and the dam mask pattern may be formed without using technology, such as DPT or QPT, for increasing a pattern density.

In some embodiments, the landing pad mask pattern and the dam mask pattern may be simultaneously formed by EUV lithography. In some embodiments, the landing pad mask pattern and the dam mask pattern may be respectively formed by separate EUV lithography processes.

Thereafter, the landing pad material layer may be partially removed using the landing pad mask pattern and the dam mask pattern as etching masks, thereby forming the landing pads 190 and the dam structure 190D separated from the landing pads 190 with the recess 190R between the dam structure 190D and the landing pads 190.

Referring to FIGS. 10A through 10D, the semiconductor memory device 1 including a plurality of capacitor structures 200 may be formed by sequentially forming a plurality of lower electrodes 210, a capacitor dielectric film 220, and an upper electrode 230 on the landing pads 190 in the memory cell region CR. The lower electrodes 210 may be electrically connected to the landing pads 190, respectively. The capacitor dielectric film 220 may conformally cover the lower electrodes 210. The upper electrode 230 may cover the capacitor dielectric film 220. The upper electrode 230 may face the lower electrodes 210 with the capacitor dielectric film 220 between the upper electrode 230 and the lower electrodes 210. The capacitor dielectric film 220 and the upper electrode 230 may be integrally formed to cover the lower electrodes 210 in a certain region, e.g., the memory cell region CR. The lower electrodes 210 may form the storage nodes SN illustrated in FIG. 4.

Each of the lower electrodes 210 may have, but not limited to, a solid pillar shape having a circular horizontal cross-section. In some embodiments, each of the lower electrodes 210 may have a cylindrical shape with a closed bottom. In some embodiments, the lower electrodes 210 may be arranged to zigzag in the first horizontal direction (e.g., the X direction) or the second horizontal direction (e.g., the Y direction) in a honeycomb pattern. In some embodiments, the lower electrodes 210 may be arranged in lines in the first horizontal direction (e.g., the X direction) and the second horizontal direction (e.g., the Y direction) in a matrix pattern. The lower electrodes 210 may include, for example, impurity-doped silicon, a metal such as tungsten or copper, or a conductive metal compound such as titanium nitride. Although not show, the semiconductor memory device 1 may further include at least one support pattern contacting side walls of the lower electrodes 210.

The capacitor dielectric film 220 may include, for example, TaO, TaAlO, TaON, AlO, AlSiO, HfO, HfSiO, ZrO, ZrSiO, TiO, TiAlO, BST((Ba,Sr)TiO), STO(SrTiO), BTO(BaTiO), PZT(Pb(Zr,Ti)O), (Pb,La)(Zr,Ti)O, Ba(Zr,Ti)O, Sr(Zr,Ti)O, or a combination thereof.

The upper electrode 230 may include, for example, doped silicon, Ru, RuO, Pt, PtO, Ir, IrO SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN, or a combination thereof.

Before the capacitor structures 200 are formed, an insulating structure 195 filling the recess 190R may be formed. In some embodiments, the insulating structure 195 may include an interlayer insulating layer and an etch stop layer. For example, the interlayer insulating layer may include an oxide film and the etch stop layer may include a nitride film. Although the top surface of the insulating structure 195 is at the same level as the bottom surfaces of the lower electrodes 210 in FIGS. 10A through 10C, embodiments are not limited thereto. For example, the top surface of the insulating structure 195 may be at a higher level than the bottom surfaces of the lower electrodes 210, and the lower electrodes 210 may extend inside the insulating structure 195 toward the substrate 110.

The peripheral region PR and the dam region DR may be filled with a second filling insulating layer 250 to be level with the capacitor structures 200. The second filling insulating layer 250 may include, for example, an oxide film or an ultra-low K (ULK) film. The oxide film may include a film selected from a borophosphosilicate glass (BPSG) film, a phosphosilicate glass (PSG) film, a borosilicate glass (BSG) film, an un-doped silicate glass (USG) film, a tetra-ethyl-ortho-silicate (TEOS) film, and a high density plasma (HDP) film. The ULK film may include, for example, a film selected from a SiOC film and a SiCOH film, each having an ultra low dielectric constant K of about 2.2 to about 2.4.

In this specification, it is illustrated that the peripheral region PR is filled with insulating materials, e.g., the first filling insulating layer 175, the insulating structure 195, and the second filling insulating layer 250, except for the gate line structures 140P, but this is just an example. Conductive wiring electrically connected to the logic active region 117 and/or the gate lines 147P and many other components may be formed in the peripheral region PR.

Referring to FIGS. 1 through 4 and FIGS. 10A through 10D, the semiconductor memory device 1 includes the peripheral region PR in which the logic active region 117 is defined, the memory cell region CR in which the active regions 118 are defined, and the dam region DR between the memory cell region CR and the peripheral region PR.

The semiconductor memory device 1 may include the gate dielectric films 122, the word lines 120, and the buried insulating films 124, which are sequentially formed in the word line trenches 120T in the memory cell region CR of the substrate 110; the insulating film pattern (including the first and second insulating film patterns 112 and 114), which covers the device isolation film 116, the active regions 118, and the buried insulating films 124; the bit line structures 140 on the insulating film pattern; the buried contacts 170, which fill the lower portions of the spaces defined by the insulating fences 180 and the insulating spacer structures 150 respectively covering the side walls of the bit line structures 140 and are connected to the active regions 118; the landing pads 190, which fill upper portions of the spaces defined by the insulating fences 180 and the insulating spacer structures 150 and extend over the bit line structures 140; and the capacitor structures 200 including the lower electrodes 210 connected to the landing pads 190, the capacitor dielectric film 220, and the upper electrode 230.

The buried contacts 170 may include the first dummy buried contacts 170X and the second dummy buried contacts 170Y. The first dummy buried contacts 170X may be arranged in at least one line in the first horizontal direction (e.g., the X direction) to be adjacent to the peripheral region PR. The second dummy buried contacts 170Y may be arranged in at least one line in the second horizontal direction (e.g., the Y direction) to be adjacent to the peripheral region PR.

The insulating fences 180 may be arranged between two adjacent insulating spacer structures 150 among the insulating spacer structures 150, which respectively cover the side walls of the bit line structures 140, to be separated from each other in the second horizontal direction (e.g., the Y direction). Each of the insulating fences 180 may extend from between two adjacent buried contacts 170 to between two adjacent landing pads 190.

The semiconductor memory device 1 includes the region isolation film 115 between the memory cell region CR and the peripheral region PR and includes the insulating film pattern (including the first and second insulating film patterns 112 and 114), which covers the logic active region 117 and the region isolation film 115, and the gate line structure 140P on the insulating film pattern in the peripheral region PR.

The semiconductor memory device 1 includes the dam structure 190D in the dam region DR. The dam structure 190D may include the first dam structure DMX extending in a longer line shape in the first horizontal direction (e.g., the X direction) and the second dam structure DMY extending in a longer line shape in the second horizontal direction (e.g., the Y direction).

In some embodiments, the dam structure 190D may be arranged on the dummy bit line structure 140D or the insulating fences 180. For example, the first dam structure DMX may be arranged on end portions of the insulating fences 180 and the bit line structures 140, which alternate with each other in the first horizontal direction (e.g., the X direction), to be adjacent to the peripheral region PR. For example, the second dam structure DMY may be arranged on the dummy bit line structure 140D in the second horizontal direction (e.g., the Y direction) to be adjacent to the peripheral region PR. The second dam structure DMY may extend from the top surfaces of the second dummy buried contacts 170Y to the top surface of the dummy bit line structure 140D.

The first dam structure DMX may extend on a portion of the insulating capping line 148 at one ends of the first dummy buried contacts 170X and the bit line structures 140, which alternate with each other, in the first horizontal direction (e.g., the X direction). The second dam structure DMY may extend on the second dummy buried contacts 170Y and the insulating fences 180, which alternate with each other, in the second horizontal direction (e.g., the Y direction).

The top surface of the dam structure 190D may be at the same level as the top surfaces of the landing pads 190, and the bottom surface of the dam structure 190D may be at the same level as the bottom surfaces of the landing pads 190. The bottom surfaces of the landing pads 190 are respectively in contact with the top surfaces of the buried contacts 170. Similarly, the bottom surface of the first dam structure DMX may be in contact with the top surfaces of the first dummy buried contacts 170X, and the bottom surface of the second dam structure DMY may be in contact with the top surfaces of the second dummy buried contacts 170Y.

In some embodiments, like the dam structure DM in FIG. 1, the first and second dam structures DMX and DMY of the dam structure 190D may be separated from each other. In some embodiments, like the dam structure DMa in FIG. 2, there may be a plurality of first dam structures DMX and a plurality of second dam structures DMY in the dam structure 190D, and the first dam structures DMX and the second dam structures DMY may be separated from one another. In some embodiments, like the dam structure DMb in FIG. 3, the first and second dam structures DMX and DMY of the dam structure 190D may be connected to each other.

Each of the top surfaces of the first and second dam structures DMX and DMY may have a side facing the memory cell region CR and a side facing the peripheral region PR, wherein the sides have a straight line shape. The sides of the top surface of the first dam structure DMX may extend in the first horizontal direction (e.g., the X direction), and the sides of the top surface of the second dam structure DMY may extend in the second horizontal direction (e.g., the Y direction). For example, the side of the top surface of the first dam structure DMX and the side of the top surface of the second dam structure DMY, the sides facing the memory cell region CR, may respectively have straight line shapes respectively extending in the first horizontal direction (e.g., the X direction) and the second horizontal direction (e.g., the Y direction), without being influenced by the shapes of the top surfaces of landing pads 190 adjacent to the first and second dam structures DMX and DMY. An upper portion of a side wall of the first dam structure DMX and an upper portion of a side wall of the second dam structure DMY may extend in the vertical direction (e.g., the Z direction) and may respectively extend in the first horizontal direction (e.g., the X direction) and the second horizontal direction (e.g., the Y direction) without being curved.

The semiconductor memory device 1 has the dam structure 190D between the memory cell region CR and the peripheral region PR, thereby decreasing process difficulty caused by the structural difference between the memory cell region CR and the peripheral region PR and securing structural reliability. In addition, the semiconductor memory device 1 has a relatively wide gap between the dam structure 190D and the landing pads 190 in the memory cell region, and the dam structure 190D has the dam opening DO in FIG. 1 or the dam opening DOa in FIG. 2, and accordingly, photoresist residues, etch by-products, or the like may be easily removed in a process of forming the landing pads 190 and the dam structure 190D. As a result, the yield and quality of semiconductor memory devices 1 may be increased.

While the inventive concept has been particularly shown and described with reference to embodiments thereof, it will be understood that various changes in form and details may be made therein without departing from the spirit and scope of the following claims.

What is claimed is:

1. A semiconductor memory device comprising:
a substrate having a memory cell region, a peripheral region, and a dam region between the memory cell region and the peripheral region, the memory cell region having a rectangular shape according to a top view and having a plurality of active regions defined therein;
a plurality of bit line structures extending on the substrate in the memory cell region to be parallel with each other in a second horizontal direction, each bit line structure including a bit line;
a plurality of buried contacts filling lower portions of spaces among the plurality of bit line structures on the substrate;
a plurality of landing pads on the plurality of buried contacts; and
a dam structure including a first dam structure and a second dam structure in the dam region and being at the same vertical level as the plurality of landing pads in a vertical direction,
wherein the first dam structure has a line shape extending lengthwise in a first horizontal direction perpendicular to the second horizontal direction, so that it has a length greater in the first horizontal direction than in the second horizontal direction,
wherein the second dam structure is separated from the first dam structure with a first dam opening between the first dam structure and the second dam structure and has a line shape extending lengthwise in the second horizontal direction, so that it has a length greater in the second horizontal direction than in the first horizontal direction,
wherein the plurality of buried contacts includes a plurality of first dummy buried contacts and a plurality of second dummy buried contacts,
wherein each of the plurality of first dummy buried contacts has a top surface contacting a bottom surface of the first dam structure,
wherein each of the plurality of second dummy buried contacts has a top surface contacting a bottom surface of the second dam structure,
wherein the plurality of first dummy buried contacts are electrically separated from the plurality of active regions, and
wherein the plurality of second dummy buried contacts are in contact with the plurality of active regions.

2. The semiconductor memory device of claim 1, wherein opposite sides of a top surface of the first dam structure extend in straight lines in the first horizontal direction and opposite sides of a top surface of the second dam structure extend in straight lines in the second horizontal direction, the opposite sides respectively facing the memory cell region and the peripheral region.

3. The semiconductor memory device of claim 1, wherein each of the plurality of landing pads has a top surface having a disc shape, and
wherein the plurality of landing pads are arranged to zigzag in the first horizontal direction or the second horizontal direction in a honeycomb pattern.

4. The semiconductor memory device of claim 1, wherein the first dam structure is arranged along a side of the rectangular shape of the memory cell region, the side of the rectangular shape extending in the first horizontal direction, and
wherein the second dam structure is arranged along a side of the rectangular shape of the memory cell region, the side of the rectangular shape extending in the second horizontal direction.

5. The semiconductor memory device of claim 4, wherein each of the first dam structure and the second dam structure has a plurality of portions separated from each other by a second dam opening,
wherein the plurality of portions of the first dam structure being sequentially arranged in the first horizontal direction, and
wherein the plurality of portions of the second dam structure being sequentially arranged in the second horizontal direction.

6. The semiconductor memory device of claim 5, wherein each of the first dam opening and the second dam opening has a width of about 1 um to about 5 um.

7. The semiconductor memory device of claim 1, further comprising:
a dummy bit line structure extending on the substrate in the second horizontal direction,
wherein the second dam structure extends from top surfaces of the plurality of second dummy buried contacts to a top surface of the dummy bit line structure.

8. The semiconductor memory device of claim 7, wherein, in the first horizontal direction, a width of the dummy bit line structure is greater than a width of each of the plurality of bit line structures.

9. The semiconductor memory device of claim 1, further comprising:
a plurality of capacitor structures formed in the memory cell region,
wherein the plurality of capacitor structures are formed by an upper electrode, a plurality of lower electrodes electrically connected to the plurality of landing pads, and a capacitor dielectric film between the upper electrode and a plurality of lower electrodes, and
wherein the dam structure is not electrically connected to the plurality of landing pads.

10. A semiconductor memory device comprising:
a substrate having a memory cell region, a peripheral region, and a dam region between the memory cell region and the peripheral region, the memory cell region having a rectangular shape according to a top view and having a plurality of active regions defined therein;
a plurality of bit line structures extending on the substrate in the memory cell region to be parallel with each other in a first horizontal direction, each bit line structure including a bit line;
a plurality of gate line structures in the peripheral region, each of the plurality of gate line structures having a gate line pattern at the same level as the bit line;
a buried contact filling a lower portion of a space between the plurality of bit line structures on the substrate;
a landing pad on the buried contact; and
a dam structure arranged along sides of the rectangular shape of the memory cell region in the dam region,
wherein a side of a top surface of the dam structure extends in a straight line and faces the memory cell region,
wherein the landing pad and the dam structure are formed of the same material,
wherein the buried contact includes a first dummy buried contact and a second dummy buried contact,
wherein each of the first dummy buried contact and the second dummy buried contact has a top surface contacting a bottom surface of the dam structure,
wherein the first dummy buried contact is electrically separated from the plurality of active regions, and
wherein the second dummy buried contact is in contact with at least one of the plurality of active regions.

11. The semiconductor memory device of claim 10, wherein the top surface of the dam structure is at the same level as a top surface of the landing pad, and
wherein a bottom surface of the dam structure is at the same level as a bottom surface of the landing pad.

12. The semiconductor memory device of claim 10, wherein, according to the top view, the dam structure has a rectangular shape surrounding the memory cell region.

13. The semiconductor memory device of claim 10, wherein the dam structure extends along four sides of the rectangular shape of the memory cell region and is separated into a plurality of portions at each corner of the rectangular shape of the memory cell region.

14. The semiconductor memory device of claim 13, wherein the dam structure includes at least two portions sequentially arranged and separated from each other along at least one of the four sides of the rectangular shape of the memory cell region.

15. The semiconductor memory device of claim 10, further comprising:
a plurality of capacitor structures formed in the memory cell region,
wherein the plurality of capacitor structures are formed by an upper electrode, a plurality of lower electrodes, and a capacitor dielectric film between the upper electrode and a plurality of lower electrodes, a corresponding lower electrode electrically connected to the landing pad, and
wherein the dam structure is not electrically connected to the landing pad.

16. A semiconductor memory device comprising:
a substrate having a memory cell region, a peripheral region, and a dam region between the memory cell region and the peripheral region, the memory cell region having a rectangular shape according to a top view and having a plurality of active regions defined therein;
a plurality of word lines extending across the plurality of active regions in the memory cell region in a first horizontal direction, the plurality of word lines being parallel with each other;
a plurality of bit line structures extending on the substrate in the memory cell region to be parallel with each other in a second horizontal direction that is perpendicular to the first horizontal direction, each bit line structure including a bit line;
a plurality of gate line structures in the peripheral region, each of the plurality of gate line structures having a gate line pattern at the same level as the bit line in a vertical direction;
a plurality of buried contacts filling lower portions of spaces among the plurality of bit line structures on the substrate;
a plurality of landing pads filling upper portions of the spaces among the plurality of bit line structures and extending over the plurality of bit line structures; and
a dam structure including a first dam structure and a second dam structure in the dam region and being at the same vertical level as the plurality of landing pads in the vertical direction,
wherein the first dam structure has a line shape extending lengthwise in the first horizontal direction, so that it has a length greater in the first horizontal direction than in the second horizontal direction,
wherein the second dam structure has a line shape extending lengthwise in the second horizontal direction, so that it has a length greater in the second horizontal direction than in the first horizontal direction,
wherein the first dam structure and the second dam structure are separated from each other by a first dam opening at a corner of the rectangular shape of the memory cell region,
wherein each of the plurality of landing pads has a top surface having a disc shape, wherein opposite sides of a top surface of the first dam structure extend in straight lines in the first horizontal direction, wherein opposite sides of a top surface of the second dam structure extend in straight lines in the second horizontal direction, wherein the opposite sides respectively face the memory cell region and the peripheral region, wherein the top surface of each of the plurality of landing pads is at the same vertical level as the top surfaces of the first and second dam structures, wherein the plurality of buried contacts includes a plurality of first dummy buried contacts and a plurality of second dummy buried contacts, wherein each of the plurality of first dummy buried contacts has a top surface contacting a bottom surface of the first dam structure, wherein each of the plurality of second dummy buried contacts has a top surface contacting a bottom surface of the second dam structure, wherein the plurality of first dummy buried contacts are electrically separated from the plurality of active regions, and wherein the plurality of second dummy buried contacts are in contact with the plurality of active regions.

17. The semiconductor memory device of claim 16, wherein at least one selected from the first dam structure and the second dam structure includes a plurality of portions separated from each other by a second dam opening along at least one side of the rectangular shape of the memory cell region.

18. The semiconductor memory device of claim 10, further comprising:
a dummy bit line structure extending on the substrate in the first horizontal direction,
wherein the dam structure extends from the top surface of the second dummy buried contact to a top surface of the dummy bit line structure.

19. The semiconductor memory device of claim 16, further comprising:
a dummy bit line structure extending on the substrate in the second horizontal direction,
wherein the second dam structure extends from the top surfaces of the plurality of second dummy buried contacts to a top surface of the dummy bit line structure.

* * * * *